US012618004B2

(12) United States Patent
Jung et al.

(10) Patent No.: US 12,618,004 B2

(45) Date of Patent: *May 5, 2026

(54) LIGHT-EMITTING ELEMENT INK AND METHOD FOR MANUFACTURING DISPLAY APPARATUS

(71) Applicant: Samsung Display Co., LTD., Yongin-si (KR)

(72) Inventors: Jae Hoon Jung, Seoul (KR); Jong Hyuk Kang, Suwon-si (KR); Hee Yeon Yoo, Hwaseong-si (KR); Hyun Min Cho, Seoul (KR); Hye Jung Hong, Cheonan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 695 days.

This patent is subject to a terminal disclaimer.

(21) Appl. No.: 17/921,083

(22) PCT Filed: Apr. 1, 2021

(86) PCT No.: PCT/KR2021/004077

§ 371 (c)(1),
(2) Date: Nov. 4, 2022

(87) PCT Pub. No.: WO2021/215693

PCT Pub. Date: Oct. 28, 2021

(65) Prior Publication Data

US 2023/0170336 A1 Jun. 1, 2023

(30) Foreign Application Priority Data

Apr. 24, 2020 (KR) ........................ 10-2020-0050110

(51) Int. Cl.
*C09K 11/02* (2006.01)
*H01L 25/075* (2006.01)

(52) U.S. Cl.
CPC .......... *C09K 11/02* (2013.01); *H01L 25/0753* (2013.01)

(58) Field of Classification Search
CPC ...................................................... B05B 14/30
See application file for complete search history.

(56) References Cited

U.S. PATENT DOCUMENTS 6,856,088 B2 2/2005 Bae et al.
8,012,527 B2 9/2011 Ha et al.
(Continued)

FOREIGN PATENT DOCUMENTS

CN 107706217 A 2/2018
CN 108206228 B 11/2022
(Continued)

OTHER PUBLICATIONS

International Search Report dated Jul. 19, 2021, for corresponding Application No. PCT/KR2021/004077 (5 pp.).
(Continued)

*Primary Examiner* — Austin Murata
(74) *Attorney, Agent, or Firm* — Womble Bond Dickinson (US) LLP

(57) ABSTRACT

A light-emitting element ink comprises: a light-emitting element solvent; and a plurality of light-emitting elements dispersed in the light-emitting element solvent and each comprising a plurality of semiconductor layers and an insulation film partially around the outer peripheral surfaces of the semiconductor layers, wherein the light-emitting element solvent includes a fatty acid ester-based compound having a melting point in the range of 0° C. to 15° C.

6 Claims, 16 Drawing Sheets

(56) References Cited

U.S. PATENT DOCUMENTS

| | | | |
|---|---|---|---|
| 8,585,454 B2 | 11/2013 | Cha et al. | |
| 9,803,137 B2 | 10/2017 | Kuzumoto et al. | |
| 2002/0001026 A1 | 1/2002 | Ishikawa et al. | |
| 2003/0127977 A1 | 7/2003 | Bae et al. | |
| 2007/0120469 A1 | 5/2007 | Ha et al. | |
| 2011/0177304 A1 | 7/2011 | Rokuhara | |
| 2012/0001124 A1 | 1/2012 | Ishino et al. | |
| 2017/0138549 A1 | 5/2017 | Do et al. | |
| 2018/0019377 A1 | 1/2018 | Kim et al. | |
| 2018/0138157 A1* | 5/2018 | Im | H10H 20/855 |
| 2018/0175104 A1 | 6/2018 | Kang et al. | |
| 2018/0375029 A1 | 12/2018 | Béalle et al. | |
| 2019/0264053 A1 | 8/2019 | Kim et al. | |
| 2020/0295263 A1* | 9/2020 | Jung | C09D 11/38 |

FOREIGN PATENT DOCUMENTS

| | | |
|---|---|---|
| JP | S 51-90386 A | 8/1976 |
| JP | 2001-98197 A | 4/2001 |
| JP | 2003-268042 A | 9/2003 |
| JP | 2003-338370 A | 11/2003 |
| JP | 2006-241383 A | 9/2006 |
| JP | 3838964 B2 | 10/2006 |
| JP | 2008-260073 A | 10/2008 |
| JP | 2010-67543 A | 3/2010 |
| JP | 2015-4957 A | 1/2015 |
| JP | 2016-74873 A | 5/2016 |
| JP | 2017-509779 A | 4/2017 |
| JP | 2020-512419 A | 4/2020 |
| KR | 10-2003-0058767 A | 7/2003 |
| KR | 10-0661642 B1 | 12/2006 |
| KR | 10-0786993 B1 | 12/2007 |
| KR | 10-2011-0056383 A | 5/2011 |
| KR | 10-2018-0055021 A | 5/2018 |
| KR | 10-2018-0130214 A | 12/2018 |
| KR | 10-2019-0070265 A | 6/2019 |
| KR | 10-2020-0111312 A | 9/2020 |
| WO | WO 2012/001744 A1 | 1/2012 |
| WO | WO 2017/102048 A1 | 6/2017 |

OTHER PUBLICATIONS

Eo, Yun Jae et al., "Enhanced DC-operated electroluminescence of forwardly aligned p/MQW/n InGaN nanorod LEDs via DC offset-AC dielectrophoresis", ACS Appl. Mater. Interfaces, 2017; DOI: 10.1021/acsami.7b09794, 34pp.

Irie, Masahiro et al., "Photoresponsive Polymers. 2. 1 Reversible Solution Viscosity Change of Polyamides having Azobenzene Residues in the Main Chain", Macromolecules, 1981, 14(2), pp. 262-267.

U.S. Office Action dated Jun. 3, 2024, issued in U.S. Appl. No. 17/310,546 (7 pages).

Chinese Office Action issued Jun. 25, 2024, in corresponding Chinese Patent Application No. CN 202080014619.1 (5 pages).

U.S. Notice of Allowance dated Sep. 17, 2024, issued in U.S. Appl. No. 17/310,546 (5 pages).

* cited by examiner

LIGHT-EMITTING ELEMENT INK AND METHOD FOR MANUFACTURING DISPLAY APPARATUS

CROSS REFERENCE TO RELATED APPLICATION(S)

This application is a U.S. National Phase Patent Application of International Patent Application Number PCT/KR2021/004077, filed on Apr. 1, 2021, which claims priority to Korean Patent Application Number 10-2020-0050110, filed on Apr. 24, 2020, the entire content of all of which is incorporated herein by reference.

BACKGROUND

1. Field

The disclosure relates to a light-emitting element ink and a method for manufacturing a display apparatus. More particularly, the disclosure relates to a light-emitting element ink including a solvent having a high melting point, and a method for manufacturing a display apparatus using the same.

2. Description of the Related Art

The importance of display devices has steadily increased with the development of multimedia technology. In response thereto, various types (or kinds) of display devices such as an organic light emitting display (OLED), a liquid crystal display (LCD) and/or the like have been used.

A display device is a device for displaying an image, and includes a display panel, such as an organic light emitting display panel and/or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

SUMMARY

The disclosure is directed to providing a light-emitting element ink in which light-emitting elements are not precipitated during storage by including a solvent having a high melting point.

The disclosure is also directed to providing a method for manufacturing a display apparatus with improved product reliability by uniformly disposing light-emitting elements per unit area using the light-emitting element ink.

It should be noted that aspects of the disclosure are not limited thereto and other aspects, which are not mentioned herein, will be apparent to those of ordinary skill in the art from the following description.

According to one or more embodiments of the disclosure, a light-emitting element ink comprises a light-emitting element solvent, and a plurality of light-emitting elements dispersed in the light-emitting element solvent and each including a plurality of semiconductor layers and an insulation film partially surrounding (e.g., being partially around) outer peripheral surfaces of the semiconductor layers, wherein the light-emitting element solvent includes a fatty acid ester-based compound having a melting point in a range of 0° C. to 15° C.

The light-emitting element solvent may include a compound represented by Chemical Formula 1 below.

Chemical Formula 1

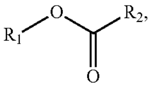

wherein, in Chemical Formula 1, $R_1$ and $R_2$ are each independently a linear or branched alkyl group, alkyl ether group, or alkenyl ether group having 1 to 25 carbon atoms, and a sum of the number of carbon atoms of $R_1$ and the number of carbon atoms of $R_2$ is in a range of 14 to 49.

At least one of $R_1$ and $R_2$ in Chemical Formula 1 may include a functional group represented by Chemical Formula 2 below.

Chemical Formula 2

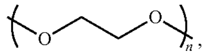

wherein, in Chemical Formula 2, n is in a range of 1 to 4, and a total number of oxygen atoms in Chemical Formula 1 is in a range of 2 to 10.

The light-emitting element solvent may include a compound represented by one of Chemical Formulas 3 to 6 below.

Chemical Formula 3

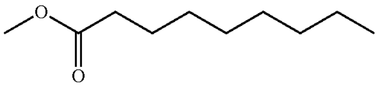

Chemical Formula 4

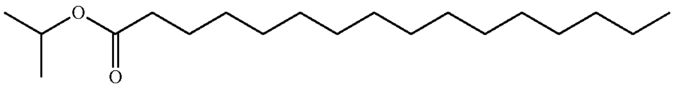

Chemical Formula 5

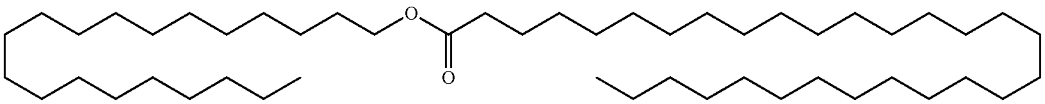

-continued

Chemical Formula 6

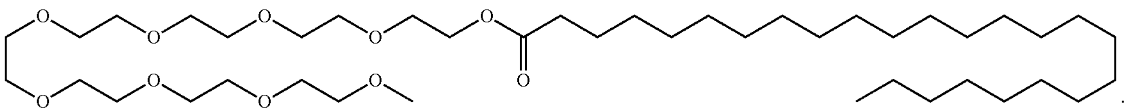

The light-emitting element solvent may have a viscosity in a range of 8 cP to 10 cP, which is measured at room temperature.

The light-emitting element solvent may have a dielectric constant in a range of 0.1 to 5.

The semiconductor layers of the light-emitting element may include a first semiconductor layer, a second semiconductor layer, and a light-emitting layer provided between the first semiconductor layer and the second semiconductor layer, and the insulation film may be provided to surround (e.g., be around) at least an outer peripheral surface of the light-emitting layer.

According to one or more embodiments of the disclosure, a method for manufacturing a display apparatus, the method comprises preparing a light-emitting element ink including a light-emitting element solvent and a plurality of light-emitting elements dispersed in the light-emitting element solvent, and a target substrate on which a first electrode and a second electrode are formed, spraying the light-emitting element ink onto the target substrate at a temperature greater than or equal to a melting point of the light-emitting element solvent, and seating each of the light-emitting elements on the first electrode and the second electrode by generating an electric field on the target substrate.

Each of the light-emitting elements may include a plurality of semiconductor layers and an insulation film partially surrounding (e.g., partially around) outer peripheral surfaces of the semiconductor layers, and the light-emitting element solvent may include an ester group and is represented by above Chemical Formula 1.

At least one of $R_1$ and $R_2$ in Chemical Formula 1 may include a functional group represented by above Chemical Formula 2.

The light-emitting element solvent may include a compound represented by one of above Chemical Formulas 3 to 6.

The melting point of the light-emitting element solvent may be in a range of 0° C. to 15° C.

The light-emitting element solvent may have a viscosity in a range of 8 cP to 10 cP and a dielectric constant in a range of 0.1 to 5, which are measured at room temperature.

In the preparing of the light-emitting element ink, the light-emitting element ink may be prepared in a state in which the light-emitting element solvent is solidified at a temperature lower than the melting point of the light-emitting element solvent.

In the spraying of the light-emitting element ink, the light-emitting element ink may be sprayed onto the target substrate after the light-emitting element solvent is melted.

In the seating of each of the light-emitting elements, the light-emitting element may have a first end portion provided on the first electrode and a second end portion provided on the second electrode.

The method may further comprise a heat treatment operation of removing the light-emitting element solvent after the seating of each of the light-emitting elements.

The heat treatment operation may be performed in a temperature range of 200° C. to 400° C.

In the seating of each of the light-emitting elements, the electric field may be generated while irradiating the light-emitting element with light.

The semiconductor layers of the light-emitting element may include a first semiconductor layer, a second semiconductor layer, and a light-emitting layer provided between the first semiconductor layer and the second semiconductor layer, and the insulation film may be provided to surround (e.g., be around) at least an outer peripheral surface of the light-emitting layer.

The details of other embodiments are included in the detailed description and the accompanying drawings.

A light-emitting element ink according to one or more embodiments includes a light-emitting element solvent having a high melting point, so that the light-emitting element solvent can be stored in a solidified state at a low temperature near room temperature. Accordingly, the light-emitting element ink can prevent or reduce the precipitation of light-emitting elements before a printing process of the light-emitting elements.

Further, in a method for manufacturing a display apparatus according to one or more embodiments, the display apparatus is manufactured using the light-emitting element ink, the precipitation of the light-emitting elements can be prevented or reduced, and the light-emitting elements can have a high dielectrophoretic reactivity in a printing process, so that a substantially uniform number of light-emitting elements can be provided for each unit area with a high degree of alignment, thereby improving the product reliability of the display apparatus.

The effects according to the embodiments are not limited by the contents exemplified above, and more various effects are included in this disclosure.

DETAILED DESCRIPTION

The disclosure will now be described more fully hereinafter with reference to the accompanying drawings, in which example embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate (e.g., without any intervening layers therebetween), or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Hereinafter, embodiments will be described with reference to the accompanying drawings.

Figure 1:
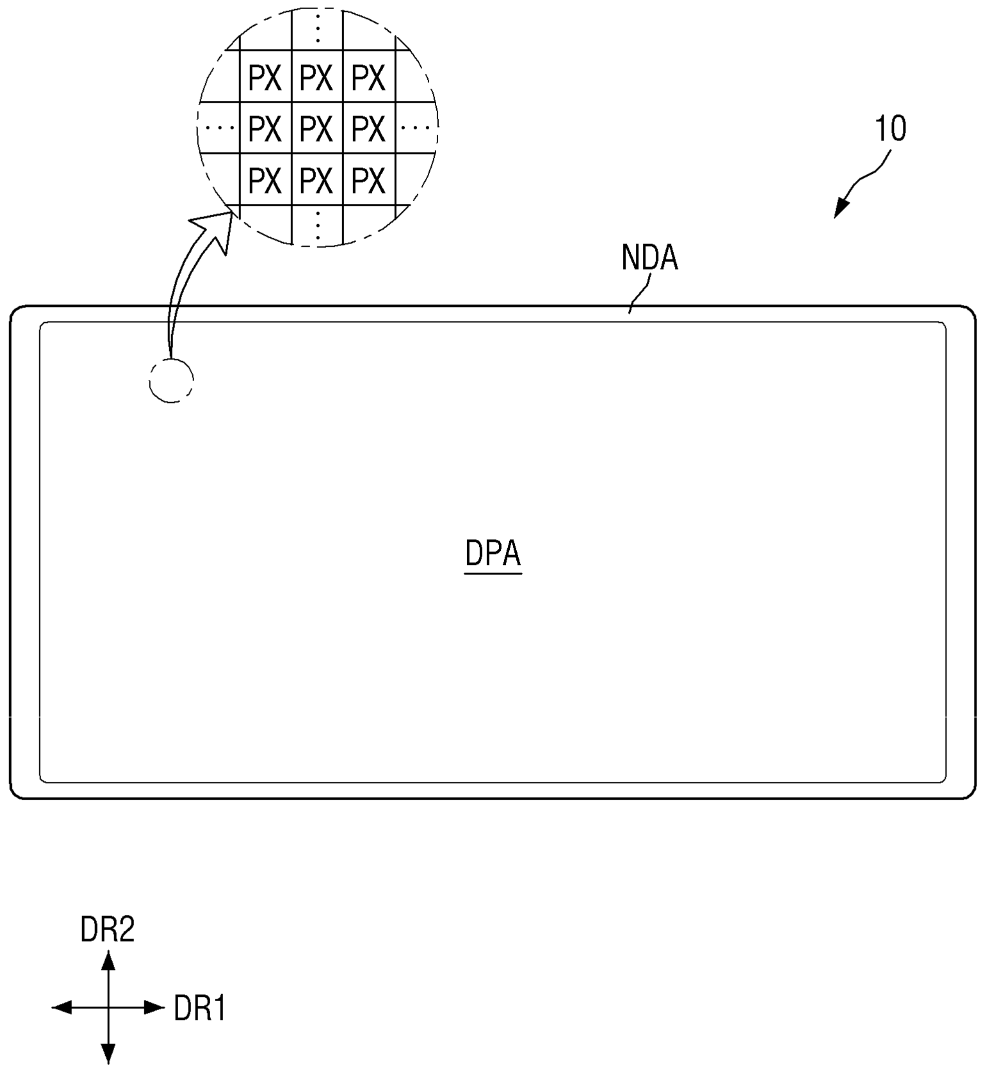
FIG. 1 is a schematic plan view of a display apparatus according to one or more embodiments.

FIG. 1 is a schematic plan view of a display apparatus according to one or more embodiments.

Referring to FIG. 1, a display apparatus 10 displays a video or a still image. The display apparatus 10 may refer to any electronic device that provides a display screen. For example, the display apparatus 10 may include a television, a laptop computer, a monitor, a billboard, an Internet of Things device, a mobile phone, a smartphone, a tablet personal computer (PC), an electronic watch, a smartwatch, a watch phone, a head-mounted display, a mobile communication terminal, an electronic organizer, an e-book reader, a portable multimedia player (PMP), a navigation system, a game console, a digital camera, and a camcorder, which are provided with a display screen.

The display apparatus 10 includes a display panel that provides a display screen. Examples of the display panel may include an inorganic light-emitting diode display panel, an organic light-emitting display panel, a quantum dot light-emitting display panel, a plasma display panel, a field emission display panel, and the like. Hereinafter, a case in which the inorganic light-emitting diode display panel is applied as an example of the display panel is illustrated, but the disclosure is not limited thereto, and a device to which the same technical spirit is applicable may be applied to other display panels.

A shape of the display apparatus 10 may be variously changed. For example, the display apparatus 10 may have shapes such as a rectangular shape of which lateral sides are long, a rectangular shape of which longitudinal sides are long, a square shape, a quadrangular shape of which corner portions (vertexes) are round, other polygonal shapes, a circular shape, and the like. The shape of a display area DPA of the display apparatus 10 may also be similar to an overall shape of the display apparatus 10. In FIG. 1, the display apparatus 10 and the display area DPA, which have the rectangular shape of which lateral sides are long, are illustrated.

The display apparatus 10 may include the display area DPA and a non-display area NDA. The display area DPA is an area in which a screen may be displayed, and the non-display area NDA is an area in which a screen is not displayed. The display area DPA may be referred to as an active area, and the non-display area NDA may be referred to as an inactive area. The display area DPA may substantially occupy a center of the display apparatus 10.

The display area DPA may include a plurality of pixels PX. The plurality of pixels PX may be arranged in a matrix direction. The shape of each pixel PX may be a rectangular shape or a square shape in a plan view but is not limited thereto, and the shape may be a rhombus shape of which each side is inclined with respect to one direction. The pixels PX may be alternately arranged as a stripe type (or stripe pattern) or a PenTile type (or PenTile pattern, where PENTILE® is a registered trademark owned by Samsung Display Co., Ltd.) In addition, each of the pixels PX may include one or more light-emitting elements 30 that emit light in a set or specific wavelength range, thereby displaying a set or specific color.

The non-display area NDA may be provided around the display area DPA. The non-display area NDA may completely or partially surround the display area DPA. The display area DPA has a rectangular shape, and the non-display area NDA may be provided adjacent to four sides of the display area DPA. The non-display area NDA may form a bezel of the display apparatus 10. In each non-display area NDA, lines or circuit drivers included in the display apparatus 10 may be provided, or external devices may be mounted.

Figure 2:
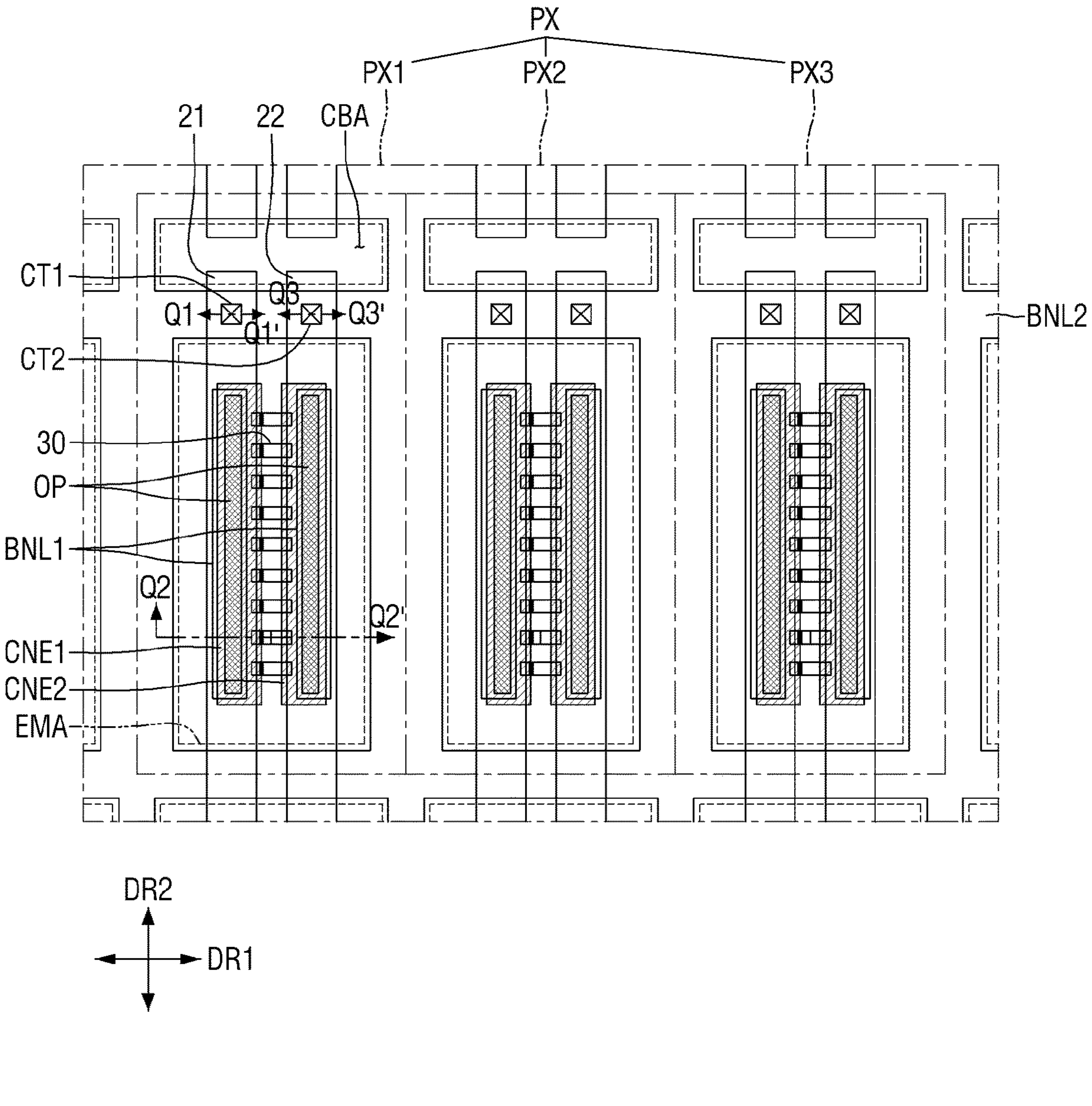
FIG. 2 is a plan view illustrating one pixel of the display apparatus according to one or more embodiments.

FIG. 2 is a plan view illustrating one pixel of the display apparatus according to one or more embodiments.

Referring to FIG. 2, each of the plurality of pixels PX may include a plurality of sub-pixels PXn (n is an integer from one to three). For example, one pixel PX may include a first sub-pixel PX1, a second sub-pixel PX2, and a third sub-pixel PX3. The first sub-pixel PX1 may emit light having a first color, the second sub-pixel PX2 may emit light having a second color, and the third sub-pixel PX3 may emit light having a third color. As an example, the first color may be a blue color, the second color may be a green color, and the third color may be a red color. However, the disclosure is not limited thereto, and each of the sub-pixels PXn may emit light having the same color. In addition, in FIG. 2, the pixel PX is illustrated as including three sub-pixels PXn, but is not limited thereto, and may include a larger number of sub-pixels PXn.

Each of the sub-pixels PXn of the display apparatus 10 may include a light-emitting area EMA and a non-light-emitting area. The light-emitting area EMA may be an area in which the light-emitting element 30 is provided so that light having a set or specific wavelength range is emitted, and the non-light-emitting area may be an area in which the light-emitting element 30 is not provided and light emitted from the light-emitting element 30 does not reach so that light is not emitted. The light-emitting area may include an area in which the light-emitting element 30 is provided and an area which is adjacent to the light-emitting element 30 and to which the light emitted from the light-emitting element 30 is output.

The disclosure is not limited thereto, and the light-emitting area may also include an area to which light emitted from the light-emitting element 30 is reflected or refracted due to another member to be emitted. A plurality of light-emitting elements 30 may be provided in each sub-pixel PXn, and an area in which the plurality of light-emitting elements 30 are provided and an area adjacent to the area may form the light-emitting area.

Further, each sub-pixel PXn may include a cut-out area CBA provided in the non-light-emitting area. The cut-out area CBA may be provided at one side of the light-emitting area EMA in a second direction DR2. The cut-out area CBA may be provided between the light-emitting areas EMA of the sub-pixels PXn adjacent in the second direction DR2. For example, a plurality of light-emitting areas EMA and a plurality of cut-out areas CBA may be arranged in the display area DPA of the display apparatus 10. For example, the plurality of light-emitting areas EMA and the plurality of cut-out areas CBA may be repeatedly arranged respectively with each other in a first direction DR1, and the light-emitting areas EMA and the cut-out areas CBA may be alternately arranged with each other in the second direction DR2. In some embodiments, a spacing interval between the adjacent cut-out areas CBA in the first direction DR1 may be less than a spacing interval between the adjacent light-emitting areas EMA in the first direction DR1. A second bank BNL2 may be provided between the cut-out areas CBA and between the light-emitting areas EMA, and an interval therebetween may vary according to a width of the second bank BNL2. Because the light-emitting element 30 is not provided in the cut-out area CBA, light is not emitted through the cut-out area CBA, but some of electrodes 21 and 22 provided in each sub-pixel PXn may be provided in the cut-out area CBA. The electrodes 21 and 22 provided for each sub-pixel PXn may be separated from each other and provided in the cut-out area CBA.

Figure 3:
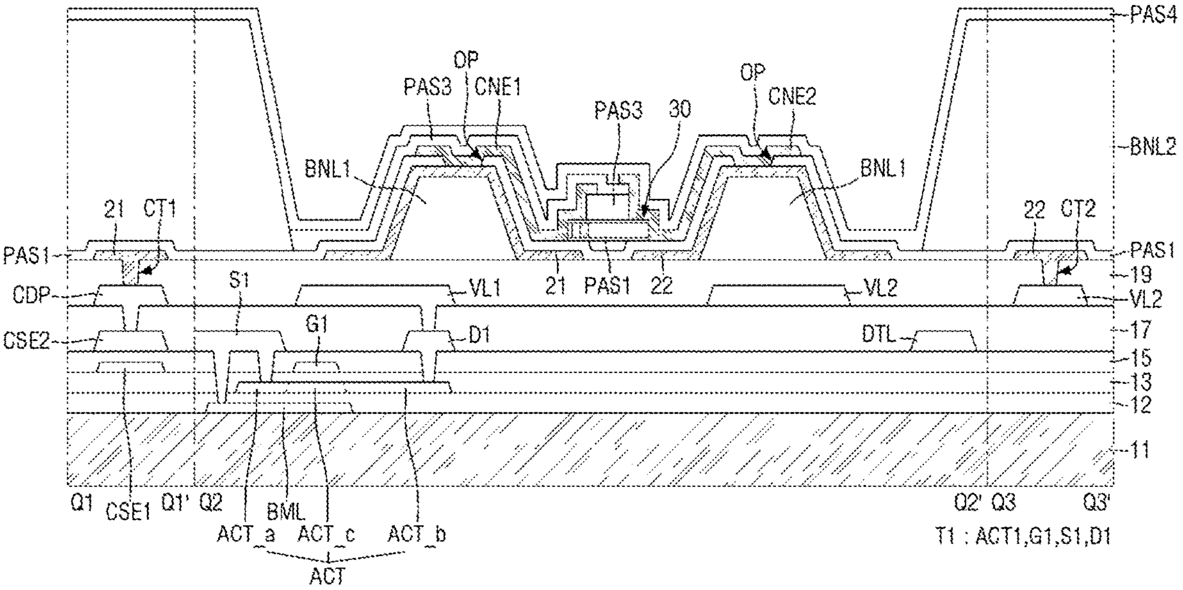
FIG. 3 is a cross-sectional view taken along lines Q1-Q1', Q2-Q2', and Q3-Q3' of FIG. 2.

FIG. 3 is a cross-sectional view taken along lines Q1-Q1', Q2-Q2', and Q3-Q3' of FIG. 2. FIG. 3 illustrates a cross section traversing both end portions of the light-emitting element 30 provided in the first sub-pixel PX1 of FIG. 2.

Referring to FIG. 3 together with FIG. 2, the display apparatus 10 may include a first substrate 11, and a semiconductor layer, a plurality of conductive layers, and a plurality of insulation layers, which are provided on the first substrate 11. The semiconductor layer, the conductive layers, and the insulation layers may constitute a circuit layer and a light-emitting element layer of the display apparatus 10.

For example, the first substrate 11 may be an insulating substrate. The first substrate 11 may be made of an insulating material such as glass, quartz, and/or a polymer resin. In some embodiments, the first substrate 11 may be a rigid substrate but may also be a flexible substrate that is bendable, foldable, and rollable.

A first conductive layer may be provided on the first substrate 11. The first conductive layer includes at least one lower metal layer BML, and the lower metal layer BML is provided to overlap an active layer ACT1 of a first transistor T1 of the display apparatus 10. The lower metal layer BML1 may include a material that blocks light, thereby preventing or reducing light from being incident on the active layer ACT1 of the first transistor. For example, the lower metal layer BML may be made of an opaque metal material that blocks or reduces light transmission. However, the disclosure is not limited thereto, and in some cases, the lower metal layer BML may be omitted.

A buffer layer 12 may be entirely provided on the first conductive layer and the first substrate 11. The buffer layer 12 may be formed on the first substrate 11 to protect the first transistor T1 of the pixel PX from moisture permeating through the first substrate 11, which is vulnerable to moisture permeation, and may perform a surface planarization function. The buffer layer 12 may include a plurality of inorganic layers that are alternately stacked. For example, the buffer layer 12 may be formed as a double layer in which inorganic layers each including at least one of silicon oxide ($SiO_x$), silicon nitride ($SiN_x$), or silicon oxynitride ($SiO_xN_y$) are stacked, or a multilayer in which the inorganic layers are alternately stacked.

The semiconductor layer is provided on the buffer layer 12. The semiconductor layer may include the active layer ACT1 of the first transistor T1. The semiconductor layer and the active layer ACT1 may be provided to partially overlap a gate electrode G1 or the like of a second conductive layer to be described in more detail herein below.

In the drawings, only the first transistor T1 among transistors included in the sub-pixel PXn of the display apparatus 10 is illustrated, but the disclosure is not limited thereto. The display apparatus 10 may include a larger number of transistors. For example, in addition to the first transistor T1, the display apparatus 10 may further include one or more transistors to include two or three transistors for each sub-pixel PXn.

The semiconductor layer may include polycrystalline silicon, single crystal silicon, an oxide semiconductor, or the like. When the semiconductor layer includes an oxide semiconductor, each active layer ACT1 may include a plurality of conductive areas ACTa and ACTb and a channel area ACTc provided therebetween. The oxide semiconductor may be an oxide semiconductor including indium (In). For example, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), or the like.

In another embodiment, the semiconductor layer may include polycrystalline silicon. The polycrystalline silicon may be formed by crystallizing amorphous silicon, and in this case, the conductive areas of the active layer ACT1 may be doped areas that are doped with impurities.

A first gate insulation layer 13 is provided on the semiconductor layer and the buffer layer 12. The first gate insulation layer 13 may serve as a gate insulation film of each of the transistors. The first gate insulation layer 13 may be formed as a double layer in which inorganic layers, each including at least one of silicon oxide ($SiO_x$), silicon nitride ($SiN_x$), or silicon oxynitride ($SiO_xN_y$), are stacked, or a multilayer in which the inorganic layers are alternately stacked.

The second conductive layer is provided on the first gate insulation layer 13. The second conductive layer may include the gate electrode G1 of the first transistor T1 and a first capacitor electrode CSE1 of a storage capacitor. The gate electrode G1 may be provided to overlap the channel area ACTc of the active layer ACT1 in a thickness direction. The first capacitor electrode CSE1 may be provided to overlap a second capacitor electrode CSE2 to be described in more detail herein below in the thickness direction. In one or more embodiments, the first capacitor electrode CSE1 may be connected to and integrated with the gate electrode G1. The first capacitor electrode CSE1 may be provided to overlap the second capacitor electrode CSE2 in the thickness direction, and the storage capacitor may be formed therebetween.

The second conductive layer may be formed as a single layer or a multilayer made of one or more selected from among molybdenum (Mo), aluminum (Al), chromium (Cr), gold (Au), titanium (Ti), nickel (Ni), neodymium (Nd), copper (Cu), or an alloy thereof. However, the disclosure is not limited thereto.

A first interlayer insulation layer 15 is provided on the second conductive layer. The first interlayer insulation layer 15 may serve as an insulation film between the second conductive layer and other layers provided thereon. In some embodiments, the first interlayer insulation layer 15 may be provided to cover the second conductive layer and may serve to protect the first conductive layer. The first interlayer insulation layer 15 may be formed as a double layer in which inorganic layers each including at least one of silicon oxide ($SiO_x$), silicon nitride ($SiN_x$), or silicon oxynitride ($SiO_xN_y$) are stacked, or a multilayer in which the inorganic layers are alternately stacked.

A third conductive layer is provided on the first interlayer insulation layer 15. The third conductive layer may include a first source electrode S1 and a first drain electrode D1 of the first transistor T1, a data line DTL, and the second capacitor electrode CSE2.

The first source electrode S1 and the first drain electrode D1 of the first transistor T1 may be in contact with the doped areas ACTa and ACTb of the active layer ACT1, respectively, through contact holes passing through a second interlayer insulation layer 17 and the first gate insulation layer 13. The first source electrode S1 of the first transistor T1 may be electrically connected to the lower metal layer BML through another contact hole.

The data line DTL may apply a data signal to another transistor included in the display apparatus 10. The data line DTL may be connected to a source/drain electrode of another transistor and transmit a signal applied from the data line DTL thereto.

The second capacitor electrode CSE2 is provided to overlap the first capacitor electrode CSE1 in the thickness direction. In one or more embodiments, the second capacitor electrode CSE2 may be integrated with and connected to the first source electrode S1.

The third conductive layer may be formed as a single layer or a multilayer made of one or more selected from among molybdenum (Mo), aluminum (Al), chromium (Cr), gold (Au), titanium (Ti), nickel (Ni), neodymium (Nd), copper (Cu), or an alloy thereof. However, the disclosure is not limited thereto.

The second interlayer insulation layer 17 is provided on the third conductive layer. The second interlayer insulation layer 17 may serve as an insulation film between the third conductive layer and other layers provided thereon. In addition, the second interlayer insulation layer 17 may cover the third conductive layer and may serve to protect the third conductive layer. The second interlayer insulation layer 17 may be formed as a double layer in which inorganic layers each including at least one of silicon oxide ($SiO_x$), silicon nitride ($SiN_x$), or silicon oxynitride ($SiO_xN_y$) are stacked, or a multilayer in which the inorganic layers are alternately stacked.

A fourth conductive layer is provided on the second interlayer insulation layer 17. The fourth conductive layer may include a first voltage line VL1, a second voltage line VL2, and a first conductive pattern CDP. A high potential voltage (or a first power voltage) to be supplied to the first transistor T1 may be applied to the first voltage line VL1, and a low potential voltage (or a second power voltage) to be supplied to a second electrode 22 may be applied to the second voltage line VL2. During a manufacturing process of the display apparatus 10, an alignment signal necessary to align the light-emitting elements 30 may be applied to the second voltage line VL2.

The first conductive pattern CDP may be connected to the second capacitor electrode CSE2 through a contact hole formed in the second interlayer insulation layer 17. The second capacitor electrode CSE2 may be integrated with the first source electrode S1 of the first transistor T1, and the first conductive pattern CDP may be electrically connected to the first source electrode S1. The first conductive pattern CDP may also be in contact with a first electrode 21 to be described in more detail herein below, and the first transistor T1 may transmit the first power voltage applied from the first voltage line VL1 to the first electrode 21 through the first conductive pattern CDP. In the drawing, the fourth conductive layer is illustrated as including one second voltage line VL2 and one first voltage line VL1, but the disclosure is not limited thereto. The fourth conductive layer may include a larger number of first voltage lines VL1 and a larger number of second voltage lines VL2.

The fourth conductive layer may be formed as a single layer or a multilayer made of one or more selected from among molybdenum (Mo), aluminum (Al), chromium (Cr), gold (Au), titanium (Ti), nickel (Ni), neodymium (Nd), copper (Cu), or an alloy thereof. However, the disclosure is not limited thereto.

A first planarization layer 19 is provided on the fourth conductive layer. The first planarization layer 19 may include an organic insulating material, for example, an organic material such as polyimide (PI), and may perform a surface planarization function.

A plurality of first banks BNL1, a plurality of electrodes 21 and 22, the light-emitting element 30, a plurality of connection electrodes CNE1 and CNE2, and the second bank BNL2 are provided on the first planarization layer 19. In addition, a plurality of insulation layers PAS1, PAS2, PAS3, and PAS4 may be provided on the first planarization layer 19.

The plurality of first banks BNL1 may be provided directly on the first planarization layer 19. Each of the plurality of first banks BNL1 may have a shape extending in the second direction DR2 in each sub-pixel PXn, but may not extend to another sub-pixel PXn adjacent in the second direction DR2, and may be provided in the light-emitting area EMA. In some embodiments, the plurality of first banks BNL1 may be provided to be spaced apart from each other in the first direction DR1, and the light-emitting element 30 may be provided therebetween. The plurality of first banks BNL1 may be provided for each sub-pixel PXn to form linear patterns in the display area DPA of the display apparatus 10. Two first banks BNL1 are illustrated in the drawings, but the disclosure is not limited thereto. A larger number of first banks BNL1 may be provided depending on the number of the electrodes 21 and 22.

The first bank BNL1 may have a structure of which at least a portion protrudes on the basis of (e.g., relative to) an upper surface of the first planarization layer 19. The protruding portion of the first bank BNL1 may have inclined side surfaces, and light emitted from the light-emitting element 30 may be reflected from the electrodes 21 and 22 provided on the first bank BNL1 and may be emitted in an upward direction with respect to the first planarization layer 19. The first bank BNL1 may provide an area in which the light-emitting element 30 is provided and simultaneously (or concurrently) may serve as a reflective partition wall that reflects light emitted from the light-emitting element 30 upward. The side surface of the first bank BNL1 may be inclined in a linear shape, but the disclosure is not limited thereto. The first bank BNL1 may have an outer surface that has a curved semi-circular or semi-elliptical shape. The first banks BNL1 may include an organic insulating material such as polyimide (PI), but the disclosure is not limited thereto.

The plurality of electrodes 21 and 22 are provided on the first banks BNL1 and the first planarization layer 19. The plurality of electrodes 21 and 22 may include the first electrode 21 and the second electrode 22. The first electrode 21 and the second electrode 22 may extend in the second direction DR2 and may be provided to be spaced apart from each other in the first direction DR1.

The first electrode 21 and the second electrode 22 may each extend in the second direction DR2 in the sub-pixel PXn and may be separated from other electrodes 21 and 22 in the cut-out area CBA. For example, the cut-out area CBA may be provided between the light-emitting areas EMA of the sub-pixels PXn that are adjacent in the second direction DR2, and in the cut-out area CBA, the first electrode 21 and the second electrode 22 may be separated from other first electrodes 21 and second electrodes 22 provided in the sub-pixels PXn that are adjacent in the second direction DR2. However, the disclosure is not limited thereto, and some of the electrodes 21 and 22 may be provided to extend over the sub-pixel PXn adjacent in the second direction DR2 instead of being separated for each sub-pixel PXn, or only one of the first electrode 21 and the second electrode 22 may be separated.

The first electrode 21 may be electrically connected to the first transistor T1 through a first contact hole CT1, and the second electrode 22 may be electrically connected to the second voltage line VL2 through a second contact hole CT2. For example, the first electrode 21 may be in contact with the first conductive pattern CDP through the first contact hole CT1 passing through the first planarization layer 19 at a portion of the second bank BNL2, which extends in the first direction DR1. Also, the second electrode 22 may be in contact with the second voltage line VL2 through the second contact hole CT2 passing through the first planarization layer 19 at a portion of the second bank BNL2, which extends in the first direction DR1. However, the disclosure is not limited thereto. In another embodiment, the first contact hole CT1 and the second contact hole CT2 may be provided in the light-emitting area EMA surrounded by the second bank BNL2 so as not to overlap the second bank BNL2.

In the drawings, it is illustrated that one first electrode 21 and one second electrode 22 are provided for each sub-pixel PXn, but the disclosure is not limited thereto, and a larger number of first electrodes 21 and second electrodes 22 may be provided for each sub-pixel PXn. In addition, the first electrode 21 and the second electrode 22 provided in each sub-pixel PXn may not necessarily have a shape extending in one direction, and the first electrode 21 and the second electrode 22 may be provided in various suitable structures. For example, the first electrode 21 and the second electrode 22 may have a shape that is partially curved or bent or may be provided so that any one electrode surrounds the other electrode.

Each of the first electrode 21 and the second electrode 22 may be provided directly on the first banks BNL1. Each of the first electrode 21 and the second electrode 22 may be formed to have a width greater than that of the first bank BNL1. For example, each of the first electrode 21 and the second electrode 22 may be provided to cover the outer surface of the first bank BNL1. Each of the first electrode 21 and the second electrode 22 may be provided on a side surface of the first bank BNL1, and an interval between the first electrode 21 and the second electrode 22 may be less than an interval between the first banks BNL1. In some embodiments, at least some areas of the first electrode 21 and the second electrode 22 may be provided directly on the first planarization layer 19 and may be coplanar with each other. However, the disclosure is not limited thereto. In some cases, the width of each of the electrodes 21 and 22 may be less than that of the first bank BNL1. However, each of the electrodes 21 and 22 may be provided to cover at least one side surface of the first bank BNL1 to reflect light emitted from the light-emitting element 30.

Each of the electrodes 21 and 22 may include a conductive material with high reflectivity. For example, the material with high reflectivity of each of the electrodes 21 and 22 may include metals such as silver (Ag), copper (Cu), and/or aluminum (Al), or may be an alloy including aluminum (Al), nickel (Ni), lanthanum (La), and the like. Each of the electrodes 21 and 22 may reflect light, which is emitted from the light-emitting element 30 and travels toward the side surface of the first bank BNL1, in an upward direction with respect to each sub-pixel PXn.

However, the disclosure is not limited thereto, and each of the electrodes 21 and 22 may further include a transparent conductive material. For example, each of the electrodes 21 and 22 may include materials such as indium tin oxide (ITO), indium zinc oxide (IZO), and/or indium tin-zinc oxide (ITZO). In some embodiments, each of the electrodes 21 and 22 may have a structure in which one or more layers of the transparent conductive material and one or more layers of the metal material with high reflectivity are stacked, or each of the electrodes 21 and 22 may be formed as a single layer that includes the transparent conductive material and the metal material with high reflectivity. For example, each of the electrodes 21 and 22 may have a stacked structure such as ITO/Ag/ITO, ITO/Ag/IZO, and/or ITO/Ag/ITZO/IZO. In some embodiments, each of the electrodes 21 and 22 may have a structure in which a metal layer such as titanium (Ti), molybdenum (Mo) and/or an alloy thereof are stacked. In some embodiments, the electrodes 21 and 22 may be formed as a double layer or a multilayer in which an alloy including aluminum (Al) and at least one metal layer made of titanium (Ti) or molybdenum (Mo) are stacked.

The plurality of electrodes 21 and 22 may be electrically connected to the light-emitting elements 30, and a set or predetermined voltage may be applied to the plurality of electrodes 21 and 22 so that the light-emitting elements 30 emit light. The plurality of electrodes 21 and 22 may be electrically connected to the light-emitting elements 30 through the connection electrodes CNE1 and CNE2 and may transmit an electrical signal applied to the electrodes 21 and 22 to the light-emitting elements 30 through the connection electrodes CNE1 and CNE2.

Further, each of the electrodes 21 and 22 may also be utilized in forming an electric field in the sub-pixel PXn to align the light-emitting elements 30. The light-emitting elements 30 may be provided between the first electrode 21 and the second electrode 22 due to the electric field formed on the first electrode 21 and the second electrode 22. The light-emitting elements 30 of the display apparatus 10 may be sprayed onto the electrodes 21 and 22 through an inkjet printing process. When an ink including the light-emitting elements 30 is sprayed onto the electrodes 21 and 22, alignment signals are applied to the electrodes 21 and 22 to generate the electric field. The light-emitting elements 30 dispersed in the ink may be aligned on the electrodes 21 and 22 due to the electric field generated on the electrodes 21 and 22.

A first insulation layer PAS1 is provided on the first planarization layer 19. The first insulation layer PAS1 may be provided to cover the first banks BNL1 and the first and second electrodes 21 and 22. The first insulation layer PAS1 may protect the first electrode 21 and the second electrode 22, and simultaneously (or concurrently), insulate the first electrode 21 from the second electrode 22. In addition, the first insulation layer PAS1 may prevent or reduce damage to the light-emitting element 30 provided on the first insulation layer PAS1 from direct contact with other members.

In one or more embodiments, the first insulation layer PAS1 may include openings OP that partially expose the first electrode 21 and the second electrode 22. Each of the openings OP may partially expose a portion of each of the electrodes 21 and 22, which is provided on an upper surface of the first bank BNL1. Portions of the connection electrodes CNE1 and CNE2 may be in contact with the electrodes 21 and 22 exposed through the openings OP, respectively.

A step difference may be formed in the first insulation layer PAS1 so that a portion of an upper surface thereof is recessed between the first electrode 21 and the second electrode 22. For example, because the first insulation layer PAS1 is provided to cover the first electrode 21 and the second electrode 22, the upper surface of the first insulation layer PAS1 may be stepped according to the shape of the electrodes 21 and 22 provided below the first insulation layer PAS1. However, the disclosure is not limited thereto.

The second bank BNL2 may be provided on the first insulation layer PAS1. The second bank BNL2 may be provided in a grid pattern, which includes portions extending in the first direction DR1 and the second direction DR2 in a plan view, on an entire surface of the display area DPA. The second bank BNL2 may be provided over boundaries of the sub-pixels PXn to distinguish adjacent sub-pixels PXn.

In some embodiments, the second bank BNL2 may be provided to surround the light-emitting area EMA and the cut-out area CBA provided for each sub-pixel PXn to distinguish the light-emitting area EMA and the cut-out area CBA. The first electrode 21 and the second electrode 22 may extend in the second direction DR2 and may be provided to cross a portion of the second bank BNL2 extending in the first direction DR1. In the portion of the second bank BNL2 extending in the second direction DR2, a portion provided between the light-emitting areas EMA may have a width greater than that of a portion provided between the cut-out areas CBA. Thus, an interval between the cut-out areas CBA may be less than an interval between the light-emitting areas EMA.

The second bank BNL2 may be formed to have a height greater than that of the first bank BNL1. The second bank BNL2 may prevent or reduce the overflow of inks to adjacent sub-pixels PXn in an inkjet printing process of the manufacturing process of the display apparatus 10, thereby separating the inks, in which different light-emitting elements 30 are dispersed in different sub-pixels PXn, so as not to be mixed with each other. Like the first bank BNL1, the second bank BNL2 may include polyimide (PI), but the disclosure is not limited thereto.

The light-emitting element 30 may be provided on the first insulation layer PAS1. The plurality of light-emitting elements 30 may be provided to be spaced apart from each other in the second direction DR2, in which each of the electrodes 21 and 22 extends, and may be aligned to be substantially parallel to each other. The light-emitting element 30 may have a shape extending in one direction, and the direction in which each of the electrodes 21 and 22 extends may be substantially perpendicular to the direction in which the light-emitting element 30 extends. However, the disclosure is not limited thereto, and the light-emitting element 30 may be obliquely provided without being perpendicular to the direction in which each of the electrodes 21 and 22 extends.

The light-emitting elements 30 provided in each sub-pixel PXn may include light-emitting layers 36 (in FIG. 4) having different materials to emit light in different wavelength ranges to the outside. Accordingly, first color light, second color light, and third color light may be emitted from the first sub-pixel PX1, the second sub-pixel PX2, and the third sub-pixel PX3, respectively. However, the disclosure is not limited thereto, and each of the sub-pixels PXn may include the same type (or kind) of light-emitting elements 30 and may emit light of substantially the same color.

Both end portions of the light-emitting element 30 may be respectively provided on the electrodes 21 and 22 between the first banks BNL1. A length at which the light-emitting element 30 extends may be greater than the interval between the first electrode 21 and the second electrode 22, and both end portions of the light-emitting element 30 may be provided on the first electrode 21 and the second electrode 22, respectively. For example, the light-emitting element 30 may be provided such that one end portion thereof is placed on the first electrode 21 and the other end portion thereof is placed on the second electrode 22.

The light-emitting element 30 may include a plurality of layers provided therein in a direction substantially perpendicular to an upper surface of the first substrate 11 or the first planarization layer 19. The light-emitting element 30 may be provided such that one direction in which the light-emitting element 30 extends is substantially parallel to the upper surface of the first planarization layer 19, and a plurality of semiconductor layers included in the light-emitting element 30 may be sequentially provided in a direction substantially parallel to the upper surface of the first planarization layer 19. However, the disclosure is not limited thereto, and in a case in which the light-emitting element 30 has a different structure, the plurality of semiconductor layers may be sequentially provided in a direction substantially perpendicular to the upper surface of the first planarization layer 19.

Both end portions of the light-emitting element 30 may be in contact with the connection electrodes CNE1 and CNE2, respectively. For example, an insulation film 38 (in FIG. 4) may not be formed and the semiconductor layer(s) may be partially exposed on surfaces of end portions of the semiconductor layers(s), in one direction in which the light-emitting element 30 extends, and the exposed semiconductor layer may be in contact with the connection electrodes CNE1 and CNE2. However, the disclosure is not limited thereto, and at least a partial area of the insulation film 38 may be removed from the light-emitting element 30 so that side surfaces of both end portions of each of the semiconductor layers may be partially exposed. The exposed side surfaces of the semiconductor layer(s) may be in direct contact with the connection electrodes CNE1 and CNE2.

A second insulation layer PAS2 may be partially provided on the light-emitting element 30. For example, the second insulation layer PAS2 may have a width less than a length of the light-emitting element 30 (e.g., in the same direction) and may be provided on the light-emitting element 30 so as to expose both end portions of the light-emitting element 30 while surrounding the light-emitting element 30. In the manufacturing process of the display apparatus 10, the second insulation layer PAS2 may be provided to cover the light-emitting element 30, the electrodes 21 and 22, and the first insulation layer PAS1 and then be removed so that both end portions of the light-emitting element 30 are exposed. The second insulation layer PAS2 may be provided to extend in the second direction DR2 on the first insulation layer PAS1 in a plan view, thereby forming a linear or island-shaped pattern in each sub-pixel PXn. The second insulation layer PAS2 may protect the light-emitting element 30 and simultaneously (or concurrently) fix (e.g., affix) the light-emitting element 30 in the manufacturing process of the display apparatus 10.

The plurality of connection electrodes CNE1 and CNE2 and a third insulation layer PAS3 may be provided on the second insulation layer PAS2.

The plurality of connection electrodes CNE1 and CNE2 may have a shape extending in one direction and may be provided on the electrodes 21 and 22, respectively. The connection electrodes CNE1 and CNE2 may include a first connection electrode CNE1 provided on the first electrode 21 and a second connection electrode CNE2 provided on the second electrode 22. The connection electrodes CNE1 and CNE2 may be provided to be spaced apart from or face each other. For example, the first connection electrode CNE1 and the second connection electrode CNE2 may be provided on the first electrode 21 and the second electrode 22, respectively, and may be spaced apart from each other in the first direction DR1. Each of the connection electrodes CNE1 and CNE2 may form a stripe pattern in the light-emitting area EMA of each sub-pixel PXn.

Each of the plurality of connection electrodes CNE1 and CNE2 may be in contact with the light-emitting elements 30. The first connection electrode CNE1 may be in contact with one end portion of each of the light-emitting elements 30, and the second connection electrode CNE2 may be in contact with the other end portion of each of the light-emitting elements 30. The semiconductor layer is exposed at both end surfaces of the light-emitting element 30 in the extending direction, and each of the connection electrodes CNE1 and CNE2 may be in contact with the exposed semiconductor layer of the light-emitting element 30 to be electrically connected to the light-emitting element 30. One side of each of the connection electrodes CNE1 and CNE2 in contact with both end portions of the light-emitting element 30 may be provided on the second insulation layer PAS2. In addition, the first connection electrode CNE1 may be in contact with the first electrode 21 through the opening OP, which exposes a portion of an upper surface of the first electrode 21, and the second connection electrode CNE2 may be in contact with the second electrode 22 through the opening OP that exposes a portion of an upper surface of the second electrode 22.

A width of each of the connection electrodes CNE1 and CNE2 that is measured in one direction may be less than a width of each of the electrodes 21 and 22 measured in the one direction. The connection electrodes CNE1 and CNE2 may be provided to be in contact with one end portion and the other end portion of the light-emitting element 30, respectively, and simultaneously (or concurrently), to cover a portion of the upper surface of each of the first electrode 21 and the second electrode 22. However, the disclosure is not limited thereto, and the connection electrodes CNE1 and CNE2 may be formed to have a width greater than that of each of the electrodes 21 and 22 to cover both sides of each of the electrodes 21 and 22.

The connection electrodes CNE1 and CNE2 may include a transparent conductive material. For example, the connection electrodes CNE1 and CNE2 may include ITO, IZO, ITZO, aluminum (Al), or the like. Light emitted from the light-emitting element 30 may pass through the connection electrodes CNE1 and CNE2 and travel toward the electrodes 21 and 22. However, the disclosure is not limited thereto.

In the drawings, two connection electrodes CNE1 and CNE2 are illustrated as being provided in one sub-pixel PXn, but the disclosure is not limited thereto. The number of the connection electrodes CNE1 and CNE2 may vary depending on the number of the electrodes 21 and 22 provided for each sub-pixel PXn.

The third insulation layer PAS3 is provided to cover the first connection electrode CNE1. The third insulation layer PAS3 may be provided to cover one side, on which the first connection electrode CNE1 is provided, on the basis of the second insulation layer PAS2, including the first connection electrode CNE1. For example, the third insulation layer PAS3 may be provided to cover the first connection electrode CNE1 and the first insulation layer PAS1 provided on the first electrode 21. Such an arrangement may be formed by a process of partially removing an insulation material layer forming the third insulation layer PAS3 in order to form the second connection electrode CNE2, after the insulation material layer is provided entirely on the light-emitting area EMA. In the above process, the insulation material layer forming the third insulation layer PAS3 may be removed along with an insulation material layer forming the second insulation layer PAS2, and one side (e.g., edge) of the third insulation layer PAS3 and one side (e.g., edge) of the second insulation layer PAS2 may be aligned with each other. The second connection electrode CNE2 may have one side provided on the third insulation layer PAS3 and may be insulated from the first connection electrode CNE1 with the third insulation layer PAS3 interposed therebetween.

A fourth insulation layer PAS4 may be entirely provided in the display area DPA of the first substrate 11. The fourth insulation layer PAS4 may serve to protect members provided on the first substrate 11 from an external environment. However, the fourth insulation layer PAS4 may be omitted.

Each of the first insulation layer PAS1, the second insulation layer PAS2, the third insulation layer PAS3, and the fourth insulation layer PAS4 described above may include an inorganic insulating material or an organic insulating material. For example, the first insulation layer PAS1, the second insulation layer PAS2, the third insulation layer PAS3, and the fourth insulation layer PAS4 may each include an inorganic insulating material such as silicon oxide ($SiO_x$), silicon nitride ($SiN_x$), silicon oxynitride ($SiO_xN_y$), aluminum oxide ($AlO_x$), and/or aluminum nitride ($AlN_x$). In one or more embodiments, the first insulation layer PAS1, the second insulation layer PAS2, the third insulation layer PAS3, and the fourth insulation layer PAS4 may each include an organic insulating material such as an acrylic resin, an epoxy resin, a phenol resin, a polyamide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, and/or a polymethyl methacrylate-polycarbonate synthetic resin. However, the disclosure is not limited thereto.

Figure 4:
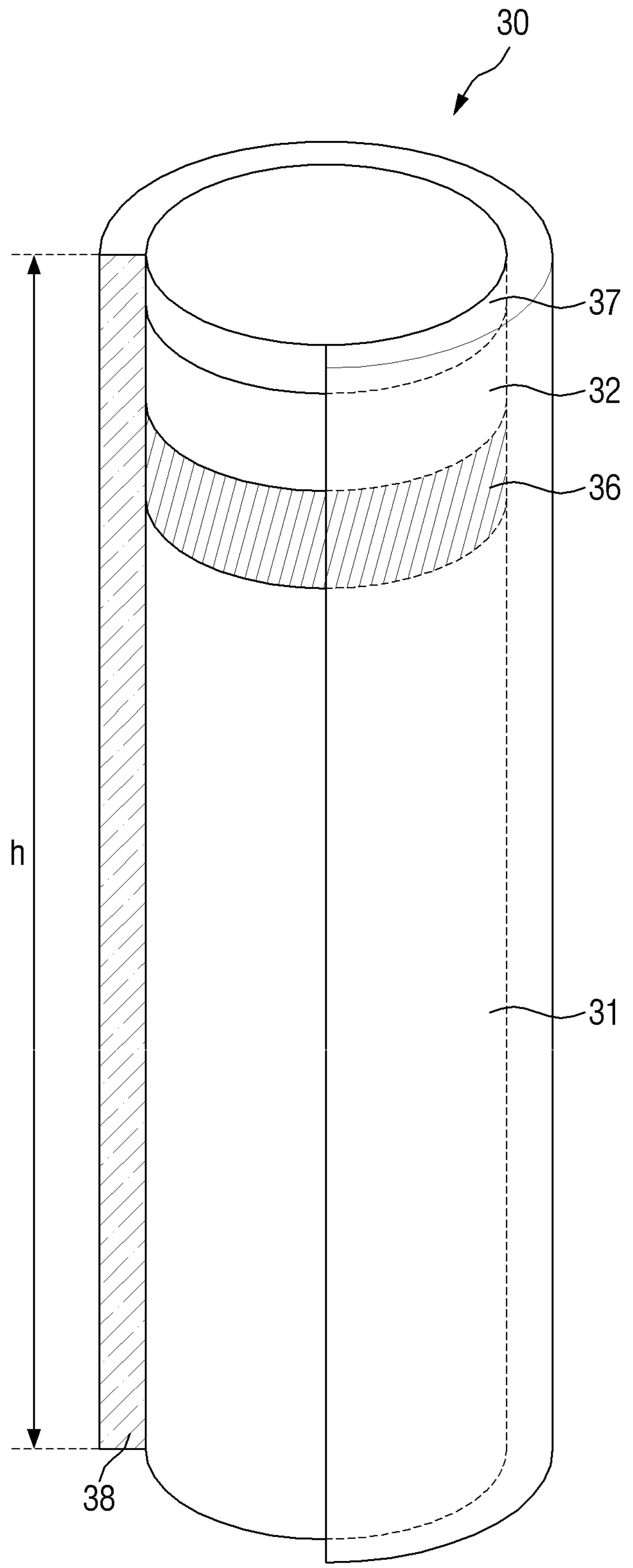
FIG. 4 is a schematic view of a light-emitting element according to one or more embodiments.

FIG. 4 is a schematic view of the light-emitting element according to one or more embodiments.

The light-emitting element 30 may be a light-emitting diode (LED), and for example, may be an inorganic LED having a size of a micrometer or nanometer unit and made of an inorganic material. The inorganic LED may be aligned between two electrodes in which a polarity is formed when an electric field is formed in a set or specific direction between the two electrodes facing each other. The light-emitting element 30 may be aligned between two electrodes due to the electric field formed on the two electrodes.

The light-emitting element 30 according to one or more embodiments may have a shape extending in one direction. The light-emitting element 30 may have a shape such as a cylinder, a rod, a wire, and/or a tube. However, the shape of the light-emitting element 30 is not limited thereto, and the light-emitting element 30 may have various suitable forms including a shape of a cube, a rectangular parallelepiped, a polygonal pillar such as a hexagonal pillar, and/or the like or a shape that extends in one direction and has a partially inclined outer surface. A plurality of semiconductors included in the light-emitting element 30, which will be described herein below, may have a structure in which the semiconductors are sequentially provided or stacked in the one direction.

The light-emitting element 30 may include a semiconductor layer doped with an arbitrary conductivity type (for example, p-type or n-type) impurity. The semiconductor layer may emit light at a set or specific wavelength range by receiving an electrical signal applied from an external power source.

Referring to FIG. 4, the light-emitting element 30 may include a first semiconductor layer 31, a second semiconductor layer 32, a light-emitting layer 36, an electrode layer 37, and an insulation film 38.

The first semiconductor layer 31 may be an n-type semiconductor. When the light-emitting element 30 emits light in a blue wavelength range, the first semiconductor layer 31 may include a semiconductor material having a chemical formula of $Al_xGa_yIn_{1-x-y}N$ (0<=x<=1, 0<=y<=1, and 0<=x+y<=1). For example, the semiconductor material may be one or more of n-type doped AlGaInN, GaN, AlGaN, InGaN, AlN, and InN. The first semiconductor layer 31 may be doped with an n-type dopant, and the n-type dopant may be Si, Ge, Sn, or the like. For example, the first semiconductor layer 31 may be n-GaN that is doped with n-type Si. The first semiconductor layer 31 may have a length in the range of 1.5 μm to 5 μm, but the disclosure is not limited thereto.

The second semiconductor layer 32 is provided on the light-emitting layer 36 to be described herein below. The second semiconductor layer 32 may be a p-type semiconductor, and when the light-emitting element 30 emits light in a blue or green wavelength range, the second semiconductor layer 32 may include a semiconductor material having a chemical formula of $Al_xGa_yIn_{1-x-y}N$ (0<=x<=1, 0<=y<=1, and 0<=x+y<=1). For example, the semiconductor material may be one or more of p-type doped AlGaInN, GaN, AlGaN, InGaN, AlN, and InN. The second semiconductor layer 32 may be doped with a p-type dopant, and the p-type dopant may be Mg, Zn, Ca, Se, Ba, or the like. For example, the second semiconductor layer 32 may be p-GaN that is doped with p-type Mg. The second semiconductor layer 32 may have a length in the range of 0.05 μm to 0.10 μm, but the disclosure is not limited thereto.

In the drawing, the first semiconductor layer 31 and the second semiconductor layer 32 are illustrated as being formed as one layer, but the disclosure is not limited thereto. The first semiconductor layer 31 and the second semiconductor layer 32 may further include a larger number of layers, e.g., a clad layer and/or a tensile strain barrier reducing (TSBR) layer according to the material of the light-emitting layer 36.

The light-emitting layer 36 is provided between the first semiconductor layer 31 and the second semiconductor layer 32. The light-emitting layer 36 may include a material having a single or multi-quantum well structure. When the light-emitting layer 36 includes a material having a multi-quantum well structure, the light-emitting layer 36 may have a structure in which a plurality of quantum layers and a plurality of well layers are alternately stacked. The light-emitting layer 36 may emit light due to combination of electron-hole pairs according to an electrical signal applied through the first semiconductor layer 31 and the second semiconductor layer 32. In a case in which the light-emitting layer 36 emits light in a blue wavelength range, the light-emitting layer 36 may include materials such as AlGaN and/or AlGaInN. In particular, in a case in which the light-emitting layer 36 has the multi-quantum well structure in which the quantum layers and the well layers are alternately stacked, the quantum layer may include a material such as AlGaN and/or AlGaInN, and the well layer may include a material such as GaN and/or AlInN. For example, the light-emitting layer 36 may include AlGaInN as a quantum layer and AlInN as a well layer. As described above, the light-emitting layer 36 may emit blue light having a central wavelength range in the range of 450 nm to 495 nm.

However, the disclosure is not limited thereto, and the light-emitting layer 36 may have a structure in which semiconductor materials with high bandgap energy and semiconductor materials with low bandgap energy are alternately stacked or may include other group III to V semiconductor materials according to a wavelength range of light being emitted. The light emitted by the light-emitting layer 36 is not limited to light in the blue wavelength range, and the light-emitting layer 36 may also emit light in a red or green wavelength range in some cases. The light-emitting layer 36 may have a length in the range of 0.05 μm to 0.10 μm, but the disclosure is not limited thereto.

In some embodiments, the light emitted from the light-emitting layer 36 may be emitted to (e.g., from) both side surfaces of the light-emitting element 30, as well as an outer surface of the light-emitting element 30, in a length direction. Directivity of the light emitted from the light-emitting layer 36 is not limited to one direction.

The electrode layer 37 may be an ohmic connection electrode. However, the disclosure is not limited thereto, and the electrode layer 37 may be a Schottky connection electrode. The light-emitting element 30 may include at least one electrode layer 37. Although the light-emitting element 30 is illustrated in FIG. 4 as including one electrode layer 37, the disclosure is not limited thereto. In some cases, the light-emitting element 30 may include a larger number of electrode layers 37, or the electrode layer 37 may be omitted. The description of the light-emitting element 30, which will be made herein below, may be identically applied even when the number of electrode layers 37 is varied or another structure is further included.

In the display apparatus 10 according to one or more embodiments, when the light-emitting element 30 is electrically connected to the electrode or the connection electrode, the electrode layer 37 may decrease resistance between the light-emitting element 30 and the electrode or between the light-emitting element 30 and the connection electrode. The electrode layer 37 may include a conductive metal. For example, the electrode layer 37 may include at least one selected from among aluminum (Al), titanium (Ti), indium (In), gold (Au), silver (Ag), indium tin oxide (ITO), indium zinc oxide (IZO), and indium tin-zinc oxide (ITZO). Further, the electrode layer 37 may include an n-type or p-type doped semiconductor material.

The insulation film 38 is provided to surround outer surfaces of the plurality of semiconductor layers and electrode layers described above. For example, the insulation film 38 may be provided to surround at least an outer surface of the light-emitting layer 36 and may extend in one direction in which the light-emitting element 30 extends. The insulation film 38 may serve to protect the members. The insulation film 38 may be formed to surround side surface portions of the members and may be formed so that both end portions of the light-emitting element 30 in a length direction are exposed.

In the drawings, the insulation film 38 is illustrated as being formed to extend in the length direction of the light-emitting element 30 to cover from the first semiconductor layer 31 to a side surface of the electrode layer 37, but the disclosure is not limited thereto. Because the insulation film 38 covers only the outer surfaces of some semiconductor layers, including the light-emitting layer 36, or covers only a portion of an outer surface of the electrode layer 37, the outer surface of the electrode layer 37 may be partially exposed. In some embodiments, an upper surface of the insulation film 38 may be formed to be rounded in a cross section in an area adjacent to at least one end portion of the light-emitting element 30.

The insulation film 38 may have a thickness in the range of 10 nm to 1.0 μm, but the disclosure is not limited thereto. For example, the thickness of the insulation film 38 may be about 40 nm.

The insulation film 38 may include materials having insulation properties, for example, silicon oxide ($SiO_x$), silicon nitride ($SiN_x$), silicon oxynitride ($SiO_xN_y$), aluminum nitride ($AlN_x$), aluminum oxide ($AlO_x$), and the like. Accordingly, it is possible to prevent or reduce an electrical short circuit that may occur when the light-emitting layer 36 is in direct contact with an electrode through which an electrical signal is transmitted to the light-emitting element 30. In addition, because the insulation film 38 protects the outer surface of the light-emitting element 30, including the light-emitting layer 36, it is possible to prevent or reduce degradation in light emission efficiency.

Further, an outer surface of the insulation film 38 may be surface-treated. The light-emitting elements 30 may be aligned by being sprayed onto electrodes in a state of being dispersed in a set or predetermined ink. Here, in order to allow the light-emitting element 30 to maintain the dispersed state without being agglomerated with an adjacent another light-emitting element 30 in the ink, the insulation film 38 may be hydrophobically or hydrophilically treated. For example, the outer surface of the insulation film 38 may be surface-treated with materials such as stearic acid and/or 2,3-naphthalene dicarboxylic acid.

The light-emitting element 30 may have a length h in the range of 1 μm to 10 μm or 2 μm to 6 μm, and for example, 3 μm to 5 μm. Further, a diameter of the light-emitting element 30 may range from 30 nm to 700 nm, and an aspect ratio of the light-emitting element 30 may range from 1.2 to 100. However, the disclosure is not limited thereto, and the plurality of light-emitting elements 30 included in the display apparatus 10 may have different diameters according to a composition difference of the light-emitting layer 36. For example, the diameter of the light-emitting element 30 may have a range of about 500 nm.

However, the shape and material of the light-emitting element 30 are not limited to those shown in FIG. 4. In some embodiments, the light-emitting element 30 may include a larger number of layers, or may have a different shape.

Figure 5:
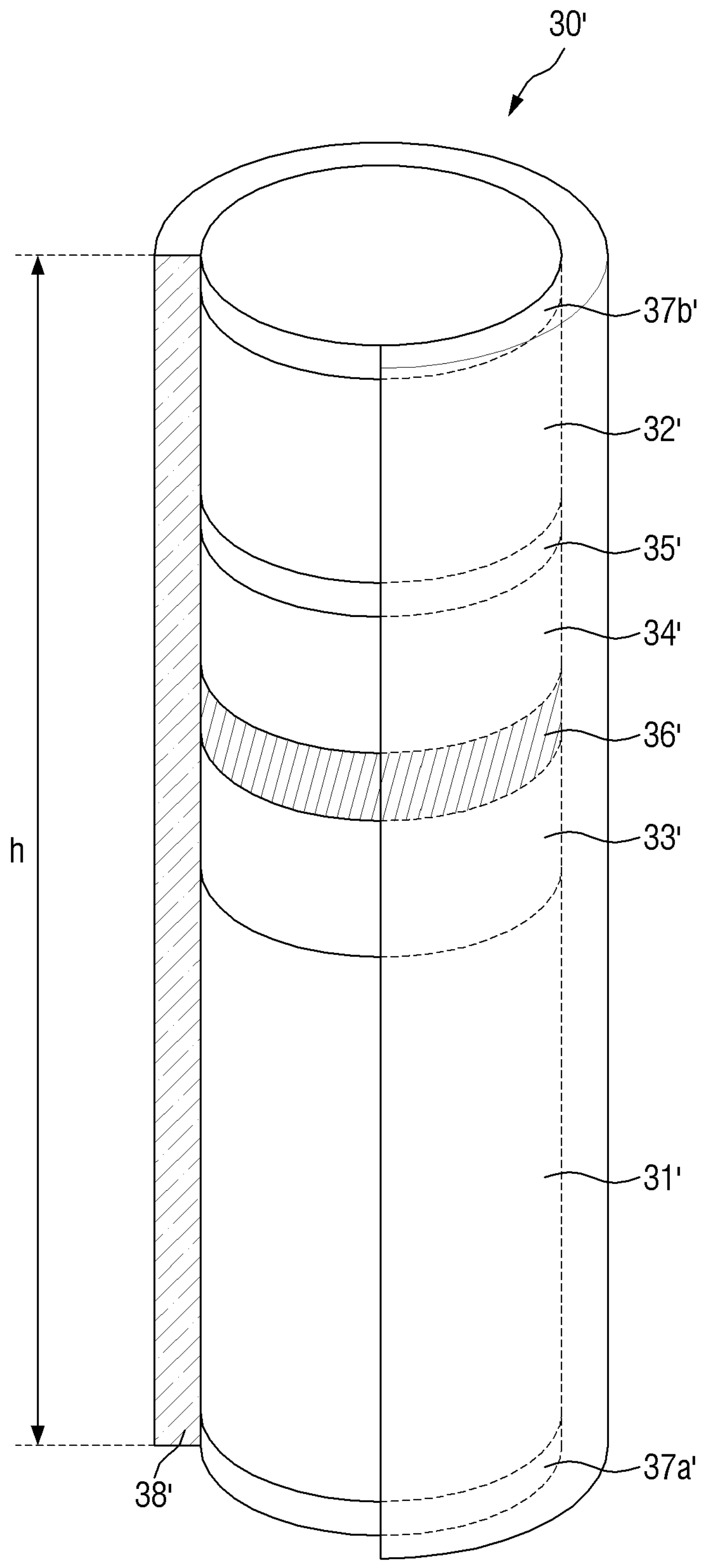
FIGS. 5 and 6 are schematic views of a light-emitting element according to one or more other embodiments.
Figure 6:
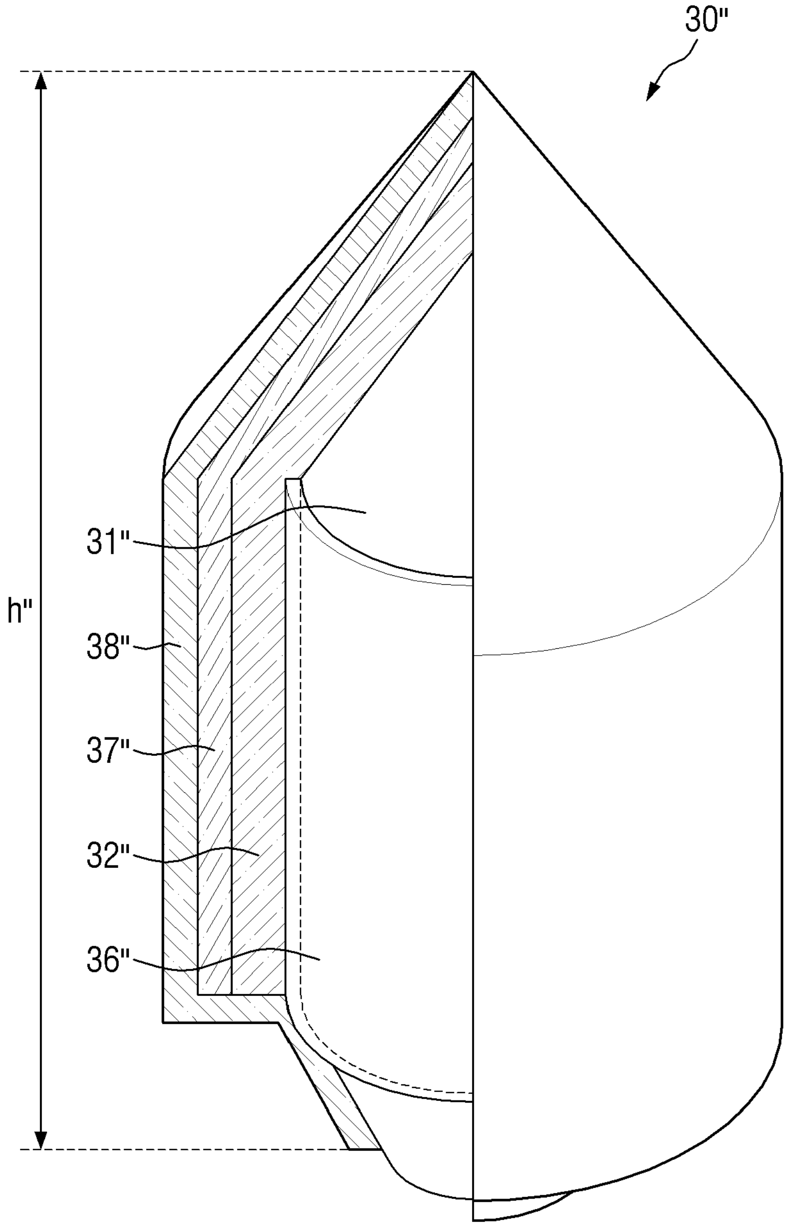

FIGS. 5 and 6 are schematic views of a light-emitting element according to one or more other embodiments.

First, referring to FIG. 5, a light-emitting element 30' according to one or more embodiments may further include a third semiconductor layer 33' provided between a first semiconductor layer 31' and a light-emitting layer 36', and a fourth semiconductor layer 34' and a fifth semiconductor layer 35' that are provided between the light-emitting layer 36' and a second semiconductor layer 32'. The embodiment of FIG. 5 is different from the embodiment of FIG. 4 in that the light-emitting element 30' of FIG. 5 further includes a plurality of semiconductor layers 33', 34', and 35' and electrode layers **37*a*' and 37*b*' provided therein, and the light-emitting layer 36'** includes different elements. Hereinafter, repeated descriptions will be omitted, and descriptions will be provided based on differences from the above-described contents.

In the light-emitting element 30 of FIG. 4, the light-emitting layer 36 may include nitrogen (N) to emit blue light or green light. In some embodiments, the light-emitting element 30' of FIG. 5 may be a semiconductor in which each of the light-emitting layer 36' and other semiconductor layers includes at least phosphorus (P). The light-emitting element 30' according to one or more embodiments may emit red light having a central wavelength range in the range of 620 nm to 750 nm. However, it should be understood that the central wavelength range of the red light is not limited to the above range and includes any suitable wavelength range that can be perceived as red in the art.

For example, the first semiconductor layer 31' is an n-type semiconductor layer, and may include a semiconductor material having a chemical formula of $In_xAl_yGa_{1-x-y}P$ ($0<=x<=1$, $0<=y<=1$, and $0<=x+y<=1$). The first semiconductor layer 31' may include at least one selected from among n-type doped InAlGaP, GaP, AlGaP, InGaP, AlP, and InP. For example, the first semiconductor layer 31' may include n-AlGaInP doped with n-type Si.

The second semiconductor layer 32' is a p-type semiconductor layer, and may include a semiconductor material having a chemical formula of $In_xAl_yGa_{1-x-y}P$ ($0<=x<=1$, $0<=y<=1$, and $0<=x+y<=1$). The second semiconductor layer 32' may include at least one selected from among p-type doped InAlGaP, GaP, AlGaP, InGaP, AlP, and InP. For example, the second semiconductor layer 32' may include p-GaP doped with p-type Mg.

The light-emitting layer 36' may be provided between the first semiconductor layer 31' and the second semiconductor layer 32'. The light-emitting layer 36' may include a material having a single or multi-quantum well structure to emit light of a set or specific wavelength range. When the light-emitting layer 36' has a multi-quantum well structure in which quantum layers and well layers are alternately stacked, the quantum layer may include a material such as AlGaP and/or AlInGaP, and the well layer may include a material such as GaP and/or AlInP. For example, the light-emitting layer 36' may include AlGaInP as the quantum layer and AlInP as the well layer so that the light-emitting layer 36' emits red light having a central wavelength range of 620 nm to 750 nm.

The light-emitting element 30' of FIG. 5 may include a clad layer provided adjacent to the light-emitting layer 36'. As shown in the drawing, the third semiconductor layer 33' and the fourth semiconductor layer 34' provided above and below the light-emitting layer 36' and between the first semiconductor layer 31' and the second semiconductor layer 32', respectively, may be clad layers.

The third semiconductor layer 33' may be provided between the first semiconductor layer 31' and the light-emitting layer 36'. The third semiconductor layer 33' may be an n-type semiconductor like the first semiconductor layer 31', and the third semiconductor layer 33' may include a semiconductor material having a chemical formula of $In_xAl_yGa_{1-x-y}P$ (0<=x<=1, 0<=y<=1, and 0<=x+y<=1). For example, the first semiconductor layer 31' may include n-AlGaInP, and the third semiconductor layer 33' may include n-AlInP. However, the disclosure is not limited thereto.

The fourth semiconductor layer 34' may be provided between the light-emitting layer 36' and the second semiconductor layer 32'. The fourth semiconductor layer 34' may be an n-type semiconductor like the second semiconductor layer 32', and the fourth semiconductor layer 34' may include a semiconductor material having a chemical formula of $In_xAl_yGa_{1-x-y}P$ (0<=x<=1, 0<=y<=1, and 0<=x+y<=1). For example, the second semiconductor layer 32' may include p-GaP, and the fourth semiconductor layer 34' may include p-AlInP.

The fifth semiconductor layer 35' may be provided between the fourth semiconductor layer 34' and the second semiconductor layer 32'. The fifth semiconductor layer 35' may include a p-type-doped semiconductor like the second semiconductor layer 32' and the fourth semiconductor layer 34'. In some embodiments, the fifth semiconductor layer 35' may serve to reduce a difference in a lattice constant between the fourth semiconductor layer 34' and the second semiconductor layer 32'. The fifth semiconductor layer 35' may be a TSBR layer. For example, the fifth semiconductor layer 35' may include p-GaInP, p-AlInP, p-AlGaInP, or the like, but the disclosure is not limited thereto. In addition, the third semiconductor layer 33', the fourth semiconductor layer 34', and the fifth semiconductor layer 35' may each have a length in the range of 0.08 μm to 0.25 μm, but the disclosure is not limited thereto.

A first electrode layer **37*a*' and a second electrode layer 37*b*' may be provided on the first semiconductor layer 31' and the second semiconductor layer 32', respectively. The first electrode layer 37*a*' may be provided on a lower surface of the first semiconductor layer 31', and the second electrode layer 37*b*' may be provided on an upper surface of the second semiconductor layer 32'. However, the disclosure is not limited thereto, and at least one of the first electrode layer 37*a*' and the second electrode layer 37*b*' may be omitted. For example, in the light-emitting element 30', the first electrode layer 37*a*' may not be provided on the lower surface of the first semiconductor layer 31', and only one second electrode layer 37*b*' may be provided on the upper surface of the second semiconductor layer 32'**.

In one or more embodiments, referring to FIG. 6, a light-emitting element 30" may have a shape extending in one direction and have a partially inclined side surface. For example, the light-emitting element 30" according to one or more embodiments may have a partially conical shape.

The light-emitting element 30" may be formed such that a plurality of layers are not stacked in one direction and each of the plurality of layers surrounds an outer surface of another layer. The light-emitting element 30" may include a semiconductor core of which at least a partial area extends in one direction and an insulation film 38" formed to surround the semiconductor core. The semiconductor core may include a first semiconductor layer 31", a light-emitting layer 36", a second semiconductor layer 32", and an electrode layer 37".

The first semiconductor layer 31" may extend in one direction and both end portions thereof may be formed to be inclined toward a center portion thereof. The first semiconductor layer 31" may have a shape in which a rod-shaped or cylindrical main body and end portions having inclined side surfaces on upper and lower portions of the main body are formed. An upper end portion of the main body may have a slope that is steeper than a slope of a lower end portion thereof.

The light-emitting layer 36" is provided to surround an outer surface of the main body of the first semiconductor layer 31". The light-emitting layer 36" may have a ring shape extending in one direction. The light-emitting layer 36" may not be formed on upper and lower end portions of the first semiconductor layer 31". However, the disclosure is not limited thereto. Light emitted from the light-emitting layer 36" may be emitted to not only both end portions of the light-emitting element 30" in a length direction but also both side surfaces thereof based on the length direction. Compared to the light-emitting element 30 of FIG. 4, the light-emitting element 30" of FIG. 6 may include the light-emitting layer 36" having a larger area, thereby emitting a larger amount of light.

The second semiconductor layer 32" is provided to surround an outer surface of the light-emitting layer 36" and the upper end portion of the first semiconductor layer 31". The second semiconductor layer 32" may include a ring-shaped main body extending in one direction and an upper end portion having a side surface formed to be inclined. For example, the second semiconductor layer 32" may be in direct contact with a substantially parallel thereto side surface of the light-emitting layer 36" and the inclined upper end portion of the first semiconductor layer 31". However, the second semiconductor layer 32" is not formed in the lower end portion of the first semiconductor layer 31".

The electrode layer 37" is provided to surround an outer surface of the second semiconductor layer 32". The shape of the electrode layer 37" may be substantially the same as that of the second semiconductor layer 32". The electrode layer 37" may be in full contact with the outer surface of the second semiconductor layer 32".

The insulation film 38" may be provided to surround outer surfaces of the electrode layer 37" and the first semiconductor layer 31". The insulation film 38" may be in direct contact with the electrode layer 37", the lower end portion of the first semiconductor layer 31" and exposed lower end portions of the light-emitting layer 36" and the second semiconductor layer 32".

The light-emitting elements 30 may be sprayed onto each of the electrodes 21 and 22 through an inkjet printing process. The light-emitting elements 30 may be dispersed in a solvent to be prepared in an ink state, sprayed onto the electrodes 21 and 22, and provided between the electrodes 21 and 22 through a process of applying an alignment signal to the electrodes 21 and 22. When the alignment signal is applied to each of the electrodes 21 and 22, an electric field may be formed on the electrodes 21 and 22, and the light-emitting element 30 may receive a force due to the electric field. The light-emitting element 30 to which the force is transmitted may be provided on the first electrode 21 and the second electrode 22 while the alignment direction and position thereof are changed.

The light-emitting element 30 may include a plurality of semiconductor layers and may be made of a material having a set or specific gravity greater than that of a solvent. When the light-emitting elements 30 are dispersed and stored in the solvent, the dispersion may be maintained for a set or predetermined period of time and then the light-emitting elements 30 may be gradually precipitated due to a difference in specific gravity. When the light-emitting elements 30 are precipitated in the solvent, the number of light-emitting elements 30 per ink droplet is not uniform, and accordingly, when an apparatus including the light-emitting element 30 is manufactured using the ink, the number of light-emitting elements 30 for each area is not constant, and thus the quality of a product may be lowered. According to one or more embodiments, the ink including the light-emitting elements 30 may be stored in a solid state by dispersing the light-emitting elements 30 using a solvent having a high melting point and solidifying the solvent during storage. The solvent may have a melting point in a temperature of about 15° C., rather than room temperature. After dispersing the light-emitting elements 30 in the solvent, the solvent may be solidified and stored at a temperature lower than the room temperature, and then the solvent may be melted by performing a printing process at a temperature equal to or higher than the room temperature during an inkjet printing process. In addition, the solvent may have a viscosity sufficient or suitable to be discharged through a nozzle in the inkjet printing process, so that the solvent may have a phase suitable for each process operation and may disperse the light-emitting elements 30. Hereinafter, the solvent that disperses the light-emitting elements 30 and an ink including the same will be described.

Figure 7:
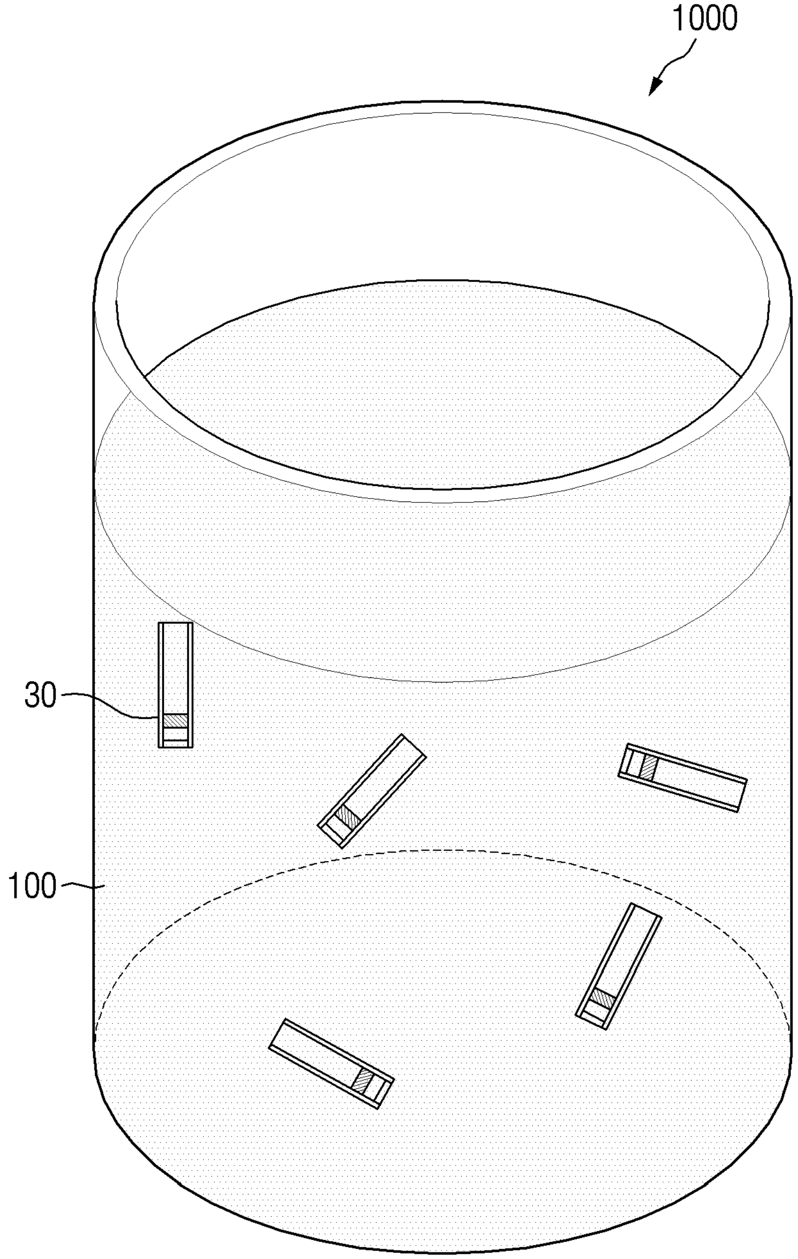
FIG. 7 is a schematic view of a light-emitting element ink according to one or more embodiments.

FIG. 7 is a schematic view of a light-emitting element ink according to one or more embodiments.

Referring to FIG. 7, a light-emitting element ink 1000 according to one or more embodiments may include a light-emitting element solvent 100 and light-emitting elements 30 dispersed in the light-emitting element solvent 100. The light-emitting element 30 may be one of the light-emitting elements 30, 30', and 30" described above with reference to FIGS. 4 to 6, and the light-emitting element 30 of FIG. 4 is exemplified in the drawing. The description of the light-emitting element 30 is the same as described above.

The light-emitting element solvent 100 may store the light-emitting elements 30, each of which includes semiconductor layers and has a high specific gravity, in a dispersed state and may be an organic solvent that does not substantially react with the light-emitting elements 30. The light-emitting element solvent 100 may have a viscosity sufficient or suitable to be discharged through a nozzle of an inkjet printing device in a liquid state. Solvent molecules of the light-emitting element solvent 100 may disperse the light-emitting elements 30 while surrounding surfaces of the light-emitting elements 30.

In the specification, it may be understood that the term "light-emitting element solvent 100" refers to a solvent in which the light-emitting elements 30 can be dispersed, or a medium thereof, and the term "solvent molecule" refers to a molecule constituting the light-emitting element solvent 100. As will be described herein below, it may be understood that the term "light-emitting element solvent 100" is a liquid medium including "solvent molecules" and formed by the "solvent molecules." However, these terms may not necessarily be used separately, and in some cases, the terms "light-emitting element solvent 100" and "solvent molecule" are used interchangeably but may be substantially the same.

According to one or more embodiments, the light-emitting element solvent 100 may be an organic solvent having a relatively high melting point. The light-emitting element solvent 100 may be a solvent having a relatively high melting point as compared to a comparable organic solvent having, for example, a melting point in a temperature range of 0° C. to 15° C. The light-emitting element solvent 100 may disperse the light-emitting elements 30, each including semiconductor layers for a set or predetermined period of time. A functional group included in the solvent molecule of the light-emitting element solvent 100 may surround the surfaces of the light-emitting elements 30 and disperse the light-emitting elements 30. In addition, the light-emitting element solvent 100 may be solidified at a temperature slightly lower than room temperature, and thus, even when the light-emitting element 30 includes semiconductor materials having a high specific gravity, precipitation of the light-emitting elements 30 may be prevented or reduced.

Figure 8:
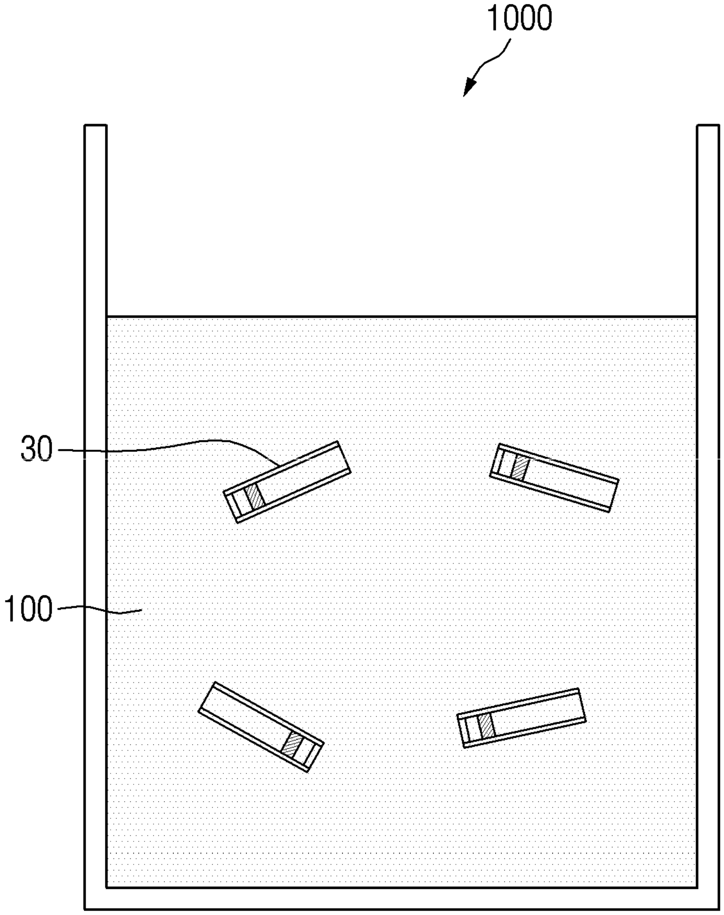
FIG. 8 is a schematic cross-sectional view illustrating a storage state of the light-emitting element ink of FIG. 7.
Figure 9:
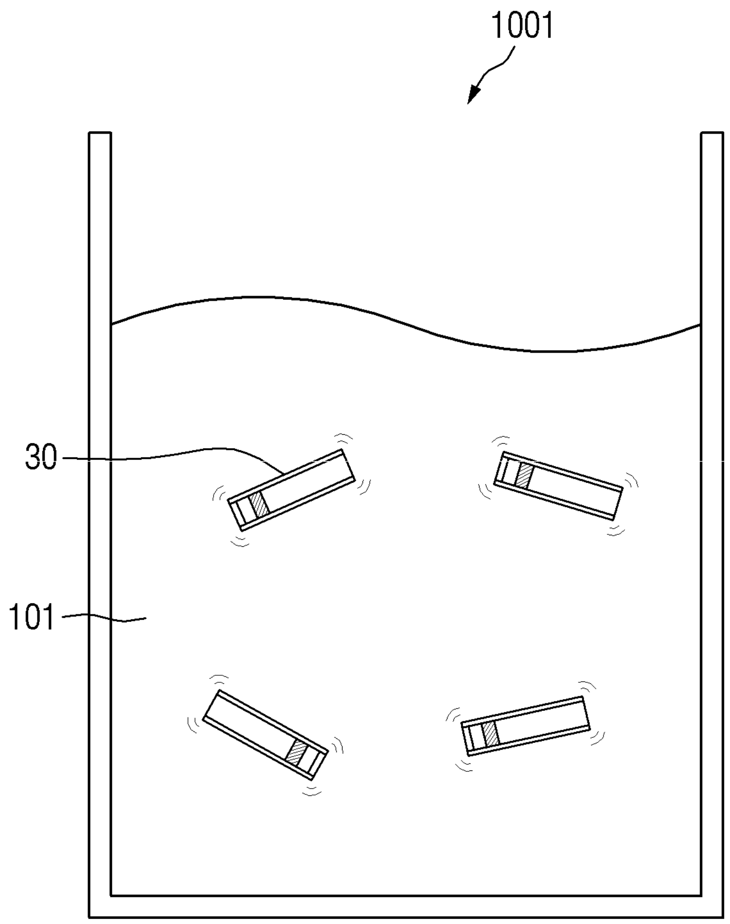
FIG. 9 is a schematic cross-sectional view illustrating a printing state of the light-emitting element ink of FIG. 7.

FIG. 8 is a schematic cross-sectional view illustrating when the light-emitting element ink of FIG. 7 is in a storage state. FIG. 9 is a schematic cross-sectional view illustrating the light-emitting element ink of FIG. 7 during a printing process. FIG. 8 illustrates a state in which the light-emitting element solvent 100 is solidified at a temperature lower than the melting point of the light-emitting element solvent 100, and FIG. 9 illustrates a state in which a light-emitting element solvent 101 is melted at a temperature higher than a melting point of the light-emitting element solvent 101.

First, referring to FIG. 8, the light-emitting element ink 1000 may be stored at a temperature lower than or equal to the melting point of the light-emitting element solvent 100. The light-emitting element solvent 100 exists in a solidified state at a temperature lower than or equal to the melting point thereof, and the light-emitting elements 30 dispersed in the light-emitting element solvent 100 may not be precipitated in the solidified light-emitting element solvent 100. For example, the light-emitting element solvent 100 may have a melting point in a temperature range that is not significantly different from 25° C., which is room temperature, and may be solidified even at a low temperature of 0° C. or higher. In one or more embodiments, the light-emitting element solvent 100 may have a melting point in the range of 0° C. to 15° C., and the light-emitting element ink 1000 may be stored at a temperature lower than or equal to the range.

For example, the light-emitting element solvent 100 may have a melting point of about 15° C., and the light-emitting element ink 1000 may be stored at a temperature of about 5° C. Because the temperature at which the light-emitting element ink 1000 is stored is different from the melting point of the light-emitting element ink 1000 by about 10° C., the solidification and melting phase change of the light-emitting element solvent 100 may be easily or suitably controlled.

Further, the light-emitting element 30 may be discharged from a nozzle through an inkjet printing process, and the printing process may be performed in a state in which the light-emitting element ink 1000 is melted at a temperature greater than or equal to the melting point thereof.

Referring to FIG. 9, a light-emitting element ink 1001 exists in a state, in which the light-emitting element solvent 101 is melted, at room temperature or higher. The light-emitting element solvent 101 may disperse the light-emitting elements 30 even when the light-emitting element solvent 101 is melted at a temperature greater than or equal to the melting point, and may flow with suitable fluidity. Although the light-emitting elements 30 dispersed in the light-emitting element solvent 101 may slowly precipitate, the printing process of the light-emitting element solvent 101 may be performed by melting the light-emitting element solvent 101 when the printing process starts. Accordingly, even when the light-emitting elements 30 include a material having a high specific gravity, the printing process may be performed before the light-emitting elements 30 are precipitated in the light-emitting element solvent 101 having fluidity, and the number of the light-emitting elements 30 per unit droplet of the light-emitting element ink 1001 discharged from the nozzle of the inkjet printing device may be substantially uniformly maintained.

In the specification, the term "printing" of the light-emitting elements 30 may mean that the light-emitting elements 30 are discharged or sprayed onto a set or predetermined object by using an inkjet printing device. For example, the term "printing" of the light-emitting element 30 may mean that the light-emitting elements 30 are discharged directly through a nozzle of the inkjet printing device or are discharged in a state in which the light-emitting elements 30 are dispersed in the light-emitting element ink 1000. The disclosure is not limited thereto, and the term "printing" of the light-emitting elements 30 may mean that the light-emitting elements 30 or the light-emitting element ink 1000 in which the light-emitting elements 30 are dispersed are sprayed onto a target substrate SUB (see FIG. 11) to allow the light-emitting elements 30 or the light-emitting element ink 1000 to be seated on the target substrate SUB.

The light-emitting element solvent 100 may have a viscosity sufficient or suitable to be discharged through the nozzle of the inkjet printing device in a state in which the light-emitting element solvent 100 is melted. In one or more embodiments, the light-emitting element solvent 100 may have a viscosity, which is measured in a state in which the light-emitting element solvent 100 is melted at room temperature (25° C.), in the range of 5 cP to 10 cP, or a viscosity of about 7 cP. The light-emitting element solvent 100 having the viscosity within the above range may be readily or suitably discharged through the nozzle, and even when the light-emitting elements 30 are slowly precipitated, because the printing process is performed before the precipitation, a degree of dispersion of the light-emitting elements 30 may be maintained.

The light-emitting element solvent 100 may prevent or reduce precipitation of the light-emitting elements 30 in the storage state of the light-emitting element ink 1000, and thus may have a relatively low viscosity and a low dielectric constant. When the light-emitting element 30 dispersed in the light-emitting element solvent 100 is placed in an electric field, the light-emitting elements 30 may react with the electric field and receive a dielectrophoretic force, and as the light-emitting element solvent 100 has a low dielectric constant, the dielectrophoretic force that the light-emitting element 30 receives by the electric field may increase. For example, the dielectrophoretic reactivity of the light-emitting element 30 may increase. The light-emitting element solvent 100 according to one or more embodiments may have a dielectric constant in the range of 0.1 to 5 or a dielectric constant of about 3, and the light-emitting element 30 dispersed therein may have increased dielectrophoretic reactivity by the electric field in the light-emitting element ink 1000. The light-emitting elements 30 may be provided in a set or specific area while the position and alignment direction thereof are changed by the dielectrophoretic force. As the light-emitting element solvent 100 has a low dielectric constant and the dielectrophoretic reactivity of the light-emitting element 30 increases, a deviation in the alignment direction and position of each of the light-emitting elements 30 may be reduced. For example, the degree of alignment of the light-emitting elements 30 may be improved.

The term "degree of alignment" of the light-emitting elements 30 may refer to a deviation in the alignment direction and seated position of the light-emitting elements 30 aligned on the target substrate SUB. For example, when the deviation in the alignment direction and seated position of the light-emitting elements 30 is large, it may be understood that the degree of alignment of the light-emitting elements 30 is low, and when the deviation in the alignment direction and seated position of the light-emitting elements 30 is small, it may be understood that the degree of alignment of the light-emitting elements 30 is high or is improved.

In one or more embodiments, the light-emitting elements 30 may be printed in a unit area by an inkjet printing process, and an apparatus manufactured using the same, for example, the display apparatus 10, may have a substantially uniform number of light-emitting elements 30 provided per unit area. In addition, because the light-emitting element solvent 100 has a relatively low dielectric constant, in the process of aligning the light-emitting elements 30, the dielectrophoretic reactivity of the light-emitting elements 30 is increased, so that the plurality of light-emitting elements 30 may have a high degree of alignment. The light-emitting element ink 1000 including the light-emitting element solvent 100 according to one or more embodiments may contribute to improving the product reliability of the display apparatus 10 in manufacturing the display apparatus 10 including the light-emitting elements 30.

According to one or more embodiments, the light-emitting element solvent 100 is a fatty acid ester-based compound, and may include a compound represented by Chemical Formula 1 below:

Chemical Formula 1

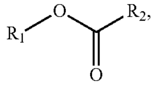

wherein, in Chemical Formula 1, $R_1$ and $R_2$ are each independently a linear or branched alkyl group, alkyl ether group, or alkenyl ether group having 1 to 25 carbon atoms, and the sum of the number of carbon atoms of $R_1$ and the number of carbon atoms of $R_2$ may be in the range of 14 to 49.

The solvent molecule of the light-emitting element solvent 100 is a fatty acid ester-based compound, and may include $R_1$ and $R_2$, which are the same or different functional groups on both sides of an ester functional group. Each of $R_1$ and $R_2$ may be one of the above-described functional groups in consideration of a melting point of the light-emitting element solvent 100, a viscosity at room temperature of the light-emitting element solvent 100, and a degree of dispersion of the light-emitting element 30. For example, in the light-emitting element solvent 100, the sum of the number of carbon atoms of the functional group $R_1$ and the number of carbon atoms of the functional group $R_2$ in Chemical Formula 1 may be in the range of 14 to 49. The total number of carbon atoms in the solvent molecule of the light-emitting element solvent 100 may be in the range of 15 to 50. When the number of carbon atoms of the solvent molecule deviates from the above range, the light-emitting element solvent 100 may not have a melting point within a desired or suitable temperature range. For example, in the solvent molecule of the light-emitting element solvent 100, when the number of carbon atoms is less than 15, the melting point may be too low, and when the number of carbon atoms is more than 50, the melting point may be too high, and the viscosity may be high when the light-emitting element solvent 100 is melted, and thus it may be impossible to discharge the light-emitting element solvent 100 through the nozzle in the printing process. The light-emitting element solvent 100 according to one or more embodiments may include the functional group and carbon atoms in the range described above in Chemical Formula 1.

In one or more embodiments, the light-emitting element solvent 100 needs to be volatilized and removed after the printing process of the light-emitting elements 30. The light-emitting element solvent 100 may be adjusted such that a boiling point of the light-emitting element solvent 100 is not too high while having a relatively high melting point. In the light-emitting element solvent 100 according to one or more embodiments, a difference between the number of carbon atoms of the functional group $R_1$ of Chemical Formula 1 and the number of carbon atoms of the functional group $R_2$ thereof may be less than 20. When solvent molecules are highly symmetrical in each molecular structure, intermolecular attraction may act more strongly in a solid state, so that the melting point may be greatly increased as compared to the boiling point. In Chemical Formula 1, it is controlled such that a difference in carbon chain length between the functional groups $R_1$ and $R_2$ is not large, and thus the boiling point of the light-emitting element solvent 100 is similar to other organic solvents, and the melting point thereof may be relatively high. For example, in the light-emitting element solvent 100, a difference in the number of carbon atoms in carbon chains between the functional groups $R_1$ and $R_2$ may be less than 15, and the solvent molecules of the light-emitting element solvent 100 may be substantially (e.g., highly) symmetrical (or symmetrical) in structure. The light-emitting element solvent 100 may have a high melting point within a range where the boiling point does not significantly increase, and may be solidified at a low temperature near room temperature.

In Chemical Formula 1, at least one of $R_1$ and $R_2$ may have a structure in which ethylene glycol ($—OCH_2CH_2O—$) units represented by Chemical Formula 2 are repeated:

Chemical Formula 2

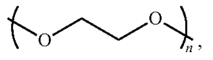

wherein, in Chemical Formula 2, n may be in the range of 1 to 4, and a total number of oxygen atoms in the light-emitting element solvent 100 may be in the range of 2 to 10. The light-emitting element solvent 100 may be a fatty acid ester-based compound including a substituent in which the ethylene glycol units are repeated, and may more smoothly or suitably disperse the light-emitting elements 30 without substantially reacting with the light-emitting elements 30. The oxygen atoms of an ethylene glycol group may chemically interact with the material of the insulation film 38 provided on the surface of the light-emitting element 30 and thus may improve the degree of dispersion of the light-emitting elements 30.

According to one or more embodiments, the light-emitting element solvent 100 may be a compound represented by one of Chemical Formulas 3 to 6 below:

[Chemical Formula 3]

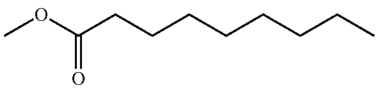

[Chemical Formula 4]

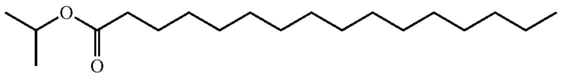

[Chemical Formula 5]

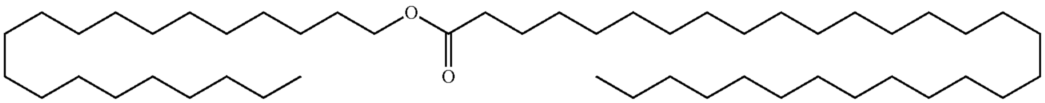

[Chemical Formula 6]

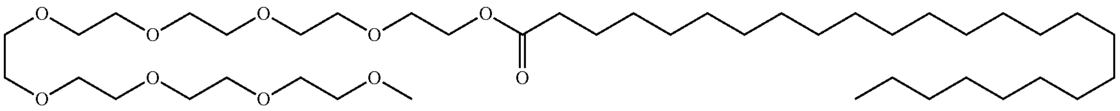

wherein, the compounds of Chemical Formulas 3 to 6 may include a fatty acid ester compound including an ester group. Each of the compounds may have 10 to 50 carbon atoms in total and 2 to 10 oxygen atoms in total while including an ester group. The compounds may have a high melting point due to the molecular structure thereof while having a boiling point that is not high as compared to other organic solvents, and may be solidified at a low temperature of 0° C. or higher and room temperature (25° C.) or less. In addition, each of the compounds may have a viscosity and a dielectric constant in the above-described range, and may be used as the light-emitting element solvent 100 of the light-emitting element ink 1000 to smoothly or suitably disperse the light-emitting elements 30.

For example, when the light-emitting element solvent 100 is isopropyl palmitate of Chemical Formula 3, the light-emitting element solvent 100 may have a melting point of 14° C., which is lower than room temperature, but may be solidified at a low temperature of 0° C. or higher. The isopropyl palmitate may have a molecular weight of about 298 and a boiling point of about 160° C., and may be volatilized and removed in the corresponding temperature range. In addition, the isopropyl palmitate may have a viscosity of about 7.0 cP and a dielectric constant of 3.2, which are measured at room temperature (25° C.), so that the light-emitting elements 30 may be smoothly or suitably discharged in the printing process and may have high dielectrophoretic reactivity.

The light-emitting element ink 1000 according to one or more embodiments includes the light-emitting element solvent 100 having a high melting point, so that the light-emitting element solvent 100 may be stored in a solidified state at a low temperature near room temperature. The light-emitting element ink 1000 includes the light-emitting elements 30 dispersed in the solidified light-emitting element solvent 100 to prevent or reduce precipitation of the light-emitting elements 30 before the printing process of the light-emitting elements 30.

Hereinafter, a manufacturing process of the display apparatus 10 according to one or more embodiments will be described with further reference to other drawings.

Figure 10:
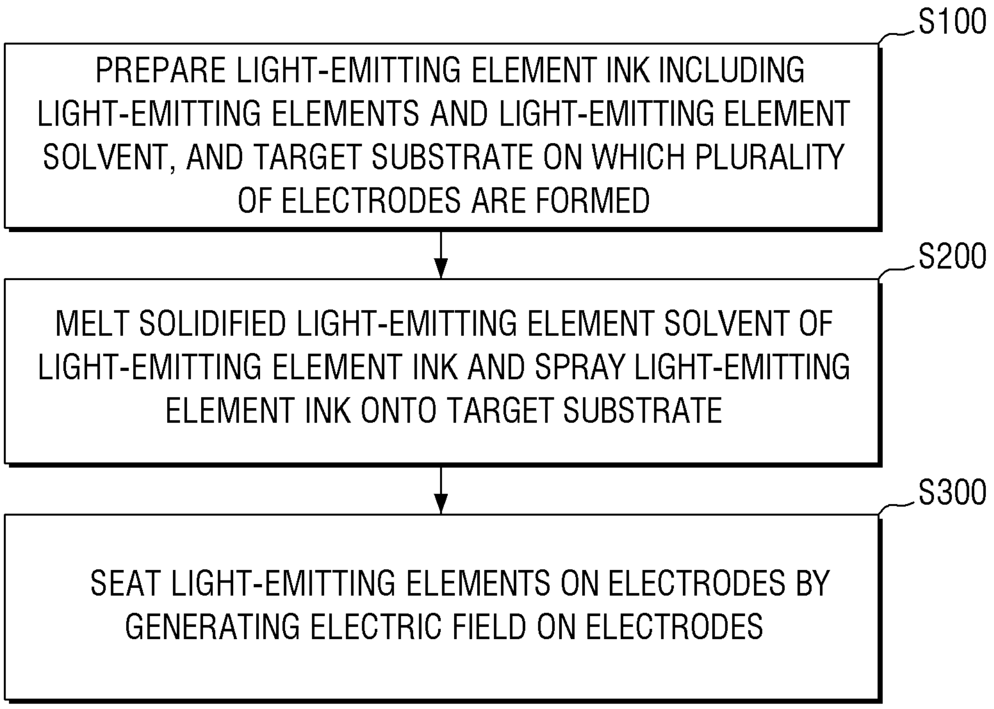
FIG. 10 is a flowchart illustrating a method for manufacturing the display apparatus according to one or more embodiments.

FIG. 10 is a flowchart illustrating a method for manufacturing the display apparatus according to one or more embodiments. FIGS. 11 to 15 are cross-sectional views illustrating portions of a manufacturing process of the display apparatus according to one or more embodiments.

Referring to FIG. 10, the method for manufacturing the display apparatus 10 according to one or more embodiments may include preparing a light-emitting element ink 1000 including light-emitting elements 30 and a light-emitting element solvent 100, and a target substrate SUB on which a plurality of electrodes 21 and 22 are formed (S100), melting the solidified light-emitting element solvent 100 of the light-emitting element ink 1000 and spraying the light-emitting element ink 1000 onto the target substrate SUB (S200), and seating the light-emitting elements 30 on the electrodes 21 and 22 by generating an electric field on the electrodes 21 and 22 (S300). The manufacturing process of the display apparatus 10 may include a process of printing the light-emitting element ink 1000, which is stored at a temperature lower than or equal to a melting point of the light-emitting element solvent 100, at a temperature greater than or equal to the melting point. The printing process of the light-emitting element ink 1000 may be performed at a different temperature from that utilized during storage while preventing or reducing the precipitation of the light-emitting elements 30, so that the light-emitting elements 30 may be smoothly or suitably printed. Hereinafter, the method for manufacturing the display apparatus 10 will be described in more detail with reference to other drawings.

Figure 11:
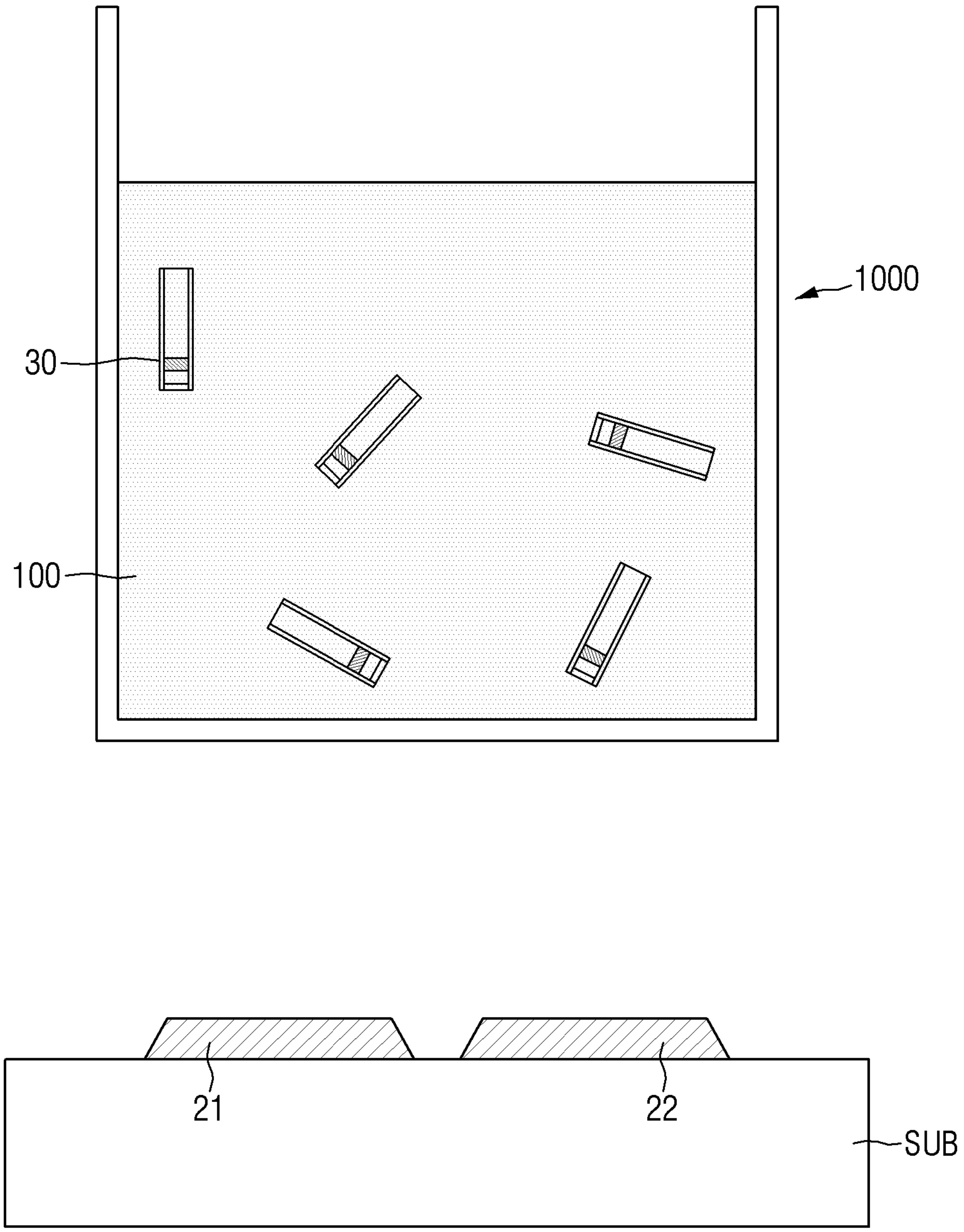
FIGS. 11-15 are cross-sectional views illustrating a portion of a manufacturing process of the display apparatus according to one or more embodiments.

First, referring to FIG. 11, the light-emitting element ink 1000 including the light-emitting elements 30 and the light-emitting element solvent 100, and the target substrate SUB on which a first electrode 21, and a second electrode 22 are provided are prepared. In the drawing, it is illustrated that a pair of electrodes are provided on the target substrate SUB, but a larger number of electrode pairs may be provided on the target substrate SUB. In some embodiments, the target substrate SUB may include a plurality of circuit elements provided thereon in addition to the first substrate 11 of the display apparatus 10, which is described above. Hereinafter, for convenience of description, the first substrate 11 and the plurality of circuit elements will not be provided.

The light-emitting element ink 1000 may include the light-emitting element solvent 100 and the light-emitting elements 30 dispersed in the light-emitting element solvent 100. In one or more embodiments, the light-emitting element ink 1000 may be stored at a temperature lower than or equal to a melting point of the light-emitting element solvent 100 and prepared in a state in which the light-emitting element solvent 100 is solidified. When the light-emitting element solvent 100 is a fatty acid ester-based compound represented by Chemical Formula 1 described above, the melting point may be in the range of 0° C. to 15° C., and the light-emitting element solvent 100 may exist in a solidified state at a low temperature lower than room temperature. For example, when the light-emitting element solvent 100 is isopropyl palmitate of Chemical Formula 3 described above, the light-emitting element ink 1000 may be stored in a temperature of about 5° C. The light-emitting elements 30 may be prepared in a state in which the light-emitting elements 30 are dispersed and not precipitated in the solidified light-emitting element solvent 100.

Figure 12:
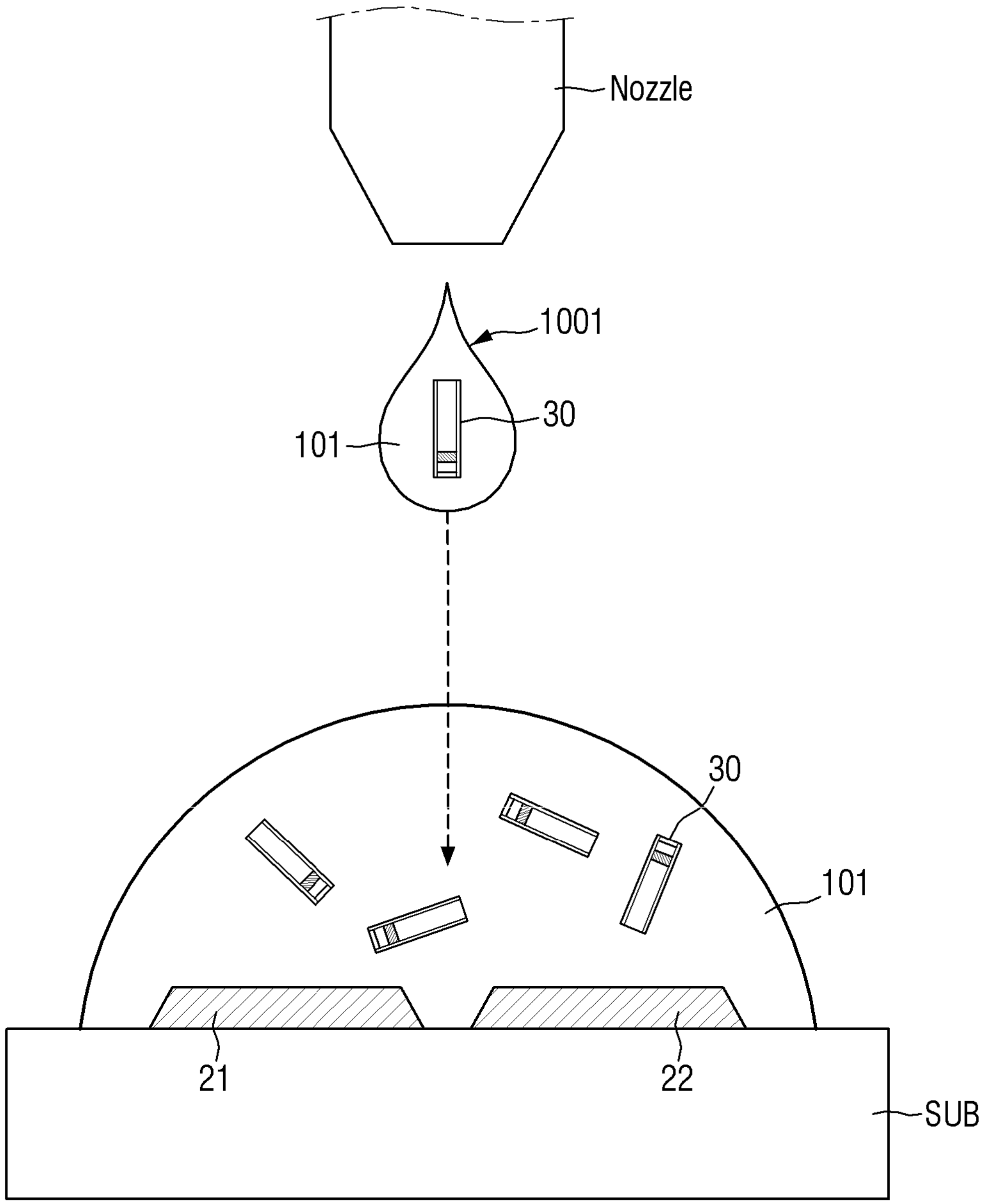
Figure 13:
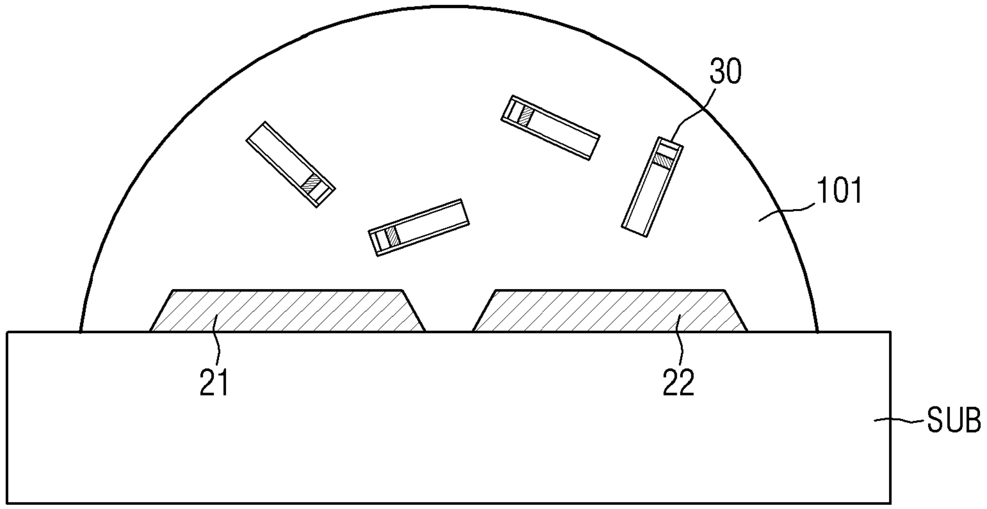

Subsequently, referring to FIGS. 12 and 13, a light-emitting element ink 1001 including the melted light-emitting element solvent 101 is sprayed onto the first electrode 21 and the second electrode 22 on the target substrate SUB. In the embodiments, the light-emitting element ink 1001 may be sprayed onto the electrodes 21 and 22 through a printing process using an inkjet printing device. The light-emitting element ink 1001 may be sprayed through a nozzle of an inkjet head included in the inkjet printing device. The light-emitting element ink 1001 may flow along an internal flow path provided in the inkjet head and may be discharged onto the target substrate SUB through the nozzle. The light-emitting element ink 1001 discharged from the nozzle may be seated on the electrodes 21 and 22 provided on the target substrate SUB. The light-emitting elements 30 may each have a shape extending in one direction, and may be dispersed in the light-emitting element ink 1001 in a state in which the extending direction of the light-emitting elements 30 has a random alignment direction.

According to one or more embodiments, the light-emitting element ink 1000 may be prepared in a state in which the light-emitting element solvent 100 is solidified, and the process of spraying the light-emitting element ink 1001 onto the target substrate SUB may be performed at a temperature greater than or equal to the melting point of the light-emitting element solvent 101. The printing process of the light-emitting element ink 1001 may be performed in a state in which the light-emitting element solvent 101 is completely melted, and the light-emitting element ink 1001 may be smoothly or suitably discharged through the nozzle of the inkjet printing device. The light-emitting element solvent 101 may have a viscosity in the range of 8 cP to 10 cP at room temperature, and the light-emitting element ink 1001 may be smoothly or suitably discharged without clogging the nozzle at room temperature or higher. In the method for manufacturing the display apparatus 10, the light-emitting element ink 1001 may be sprayed onto the target substrate SUB after the solidified light-emitting element solvent 101 is completely melted.

Figure 14:
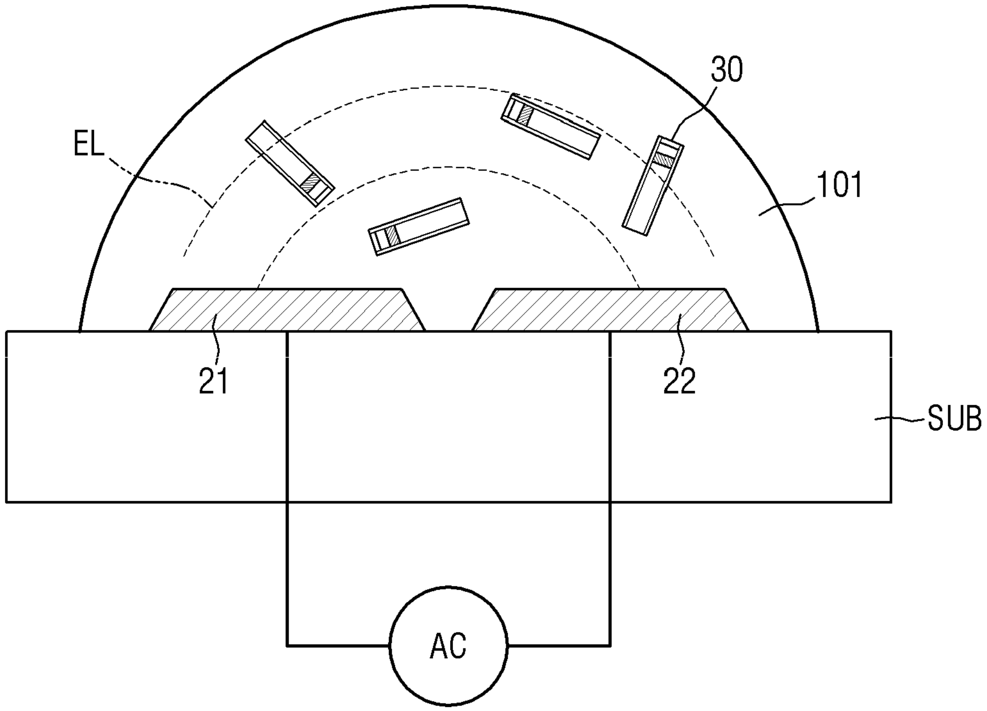

Subsequently, referring to FIG. 14, when the light-emitting element ink 1000 including the light-emitting elements 30 is sprayed onto the target substrate SUB, an alignment signal is applied to the electrodes 21 and 22 to generate an electric field EL on the target substrate SUB. The light-emitting elements 30 dispersed in the melted light-emitting element solvent 101 may receive a dielectrophoretic force due to the electric field EL, and may be provided on the electrodes 21 and 22 while the alignment direction and position thereof are changed.

When the electric field EL is generated on the target substrate SUB, the light-emitting elements 30 may receive the dielectrophoretic force. When the electric field EL generated on the target substrate SUB is generated substantially in parallel with an upper surface of the target substrate SUB, the light-emitting elements 30 may be aligned so that the direction in which the light-emitting elements 30 extend is substantially parallel to the target substrate SUB, and may be provided on the first electrode 21 and the second electrode 22. The light-emitting elements 30 may each move from the initially dispersed position toward the electrodes 21 and 22 by the dielectrophoretic force. Both end portions of each of the light-emitting elements 30 may be provided on the first electrode 21 and the second electrode 22, respectively, while the positions and alignment directions thereof are changed due to the electric field EL.

According to one or more embodiments, the light-emitting element solvent 101 has a relatively low dielectric constant, and thus the light-emitting elements 30 dispersed therein may have a large dielectrophoretic reactivity due to the electric field EL. The light-emitting element 30 may include semiconductor layers doped with different conductivity type impurities, and may have a dipole moment therein. When the light-emitting element 30 having the dipole moment is placed on the electric field EL, the light-emitting element 30 may receive the dielectrophoretic force so that both end portions thereof are provided on the electrodes 21 and 22, respectively. As the dielectric constant of the light-emitting element solvent 101 is reduced, the light-emitting element 30 may have a larger dielectrophoretic force, and the light-emitting elements 30 provided on the electrodes 21 and 22 may be provided such that the alignment direction thereof is more uniform. For example, the light-emitting element 30 may be dispersed in the light-emitting element solvent 101 having a low dielectric constant and provided on the electrodes 21 and 22 with a high degree of alignment.

Figure 15:
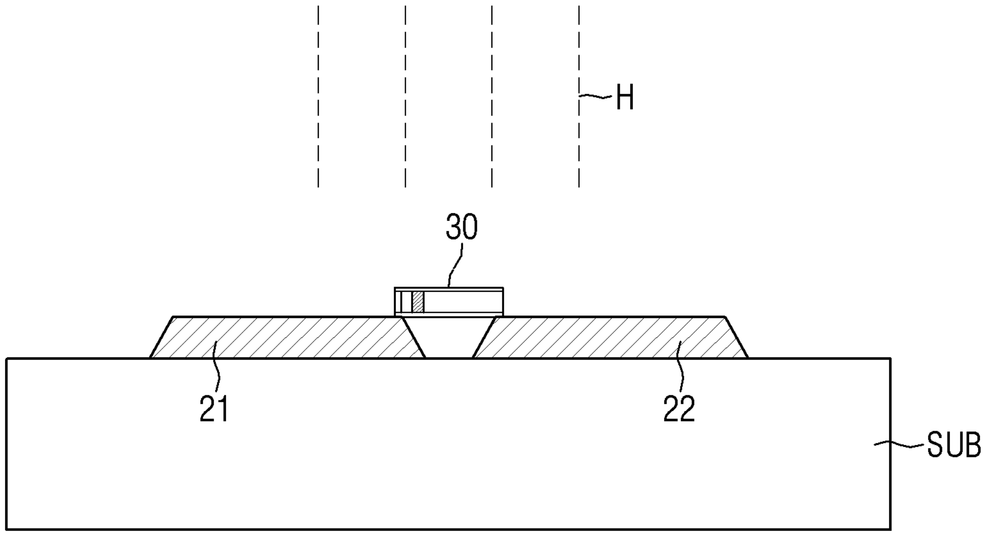

Next, referring to FIG. 15, when the light-emitting elements 30 are seated on the electrodes 21 and 22, the light-emitting element solvent 101 of the light-emitting element ink 1000 is removed. The process of removing the light-emitting element solvent 101 may be performed through a suitable or conventional heat treatment process. In one or more embodiments, the heat treatment process may be performed at a temperature in the range of 200° C. to 400° C., or a temperature of about 300° C. The light-emitting element solvent 100 may be a compound represented by one of Chemical Formulas 3 to 6 described above, and a boiling point thereof may be within the above temperature range. Although the light-emitting element solvent 100 has a relatively high melting point, the boiling point may have a similar range to other organic solvents. When the heat treatment process is performed within the above range, the light-emitting element solvent 101 may be completely removed while preventing or reducing damage to the light-emitting element 30 and the circuit elements.

Subsequently, a plurality of insulation layers and a plurality of connection electrodes 26 may be formed on the light-emitting element 30 and the electrodes 21 and 22 to manufacture the display apparatus 10. The display apparatus 10 including the light-emitting elements 30 may be manufactured through the above processes. During the manufacturing process of the display apparatus 10, the light-emitting element ink 1000 may be stored at a temperature lower than or equal to the melting point of the light-emitting element solvent 100 and may prevent or reduce precipitation of the light-emitting elements 30. The printing process of the light-emitting element ink 1000 may be performed at a temperature greater than or equal to the melting point of the light-emitting element solvent 100, and may be performed in a liquid state in which the light-emitting element solvent 100 has fluidity. The light-emitting element ink 1000 according to one or more embodiments includes the light-emitting element solvent 100 that may prevent or reduce precipitation of the light-emitting element 30 in a storage state and allow the light-emitting element 30 to have high dielectrophoretic reactivity in the printing process. When the display apparatus 10 including the light-emitting elements 30 is manufactured using the light-emitting element ink 1000, a substantially uniform number of light-emitting elements 30 may be provided for each unit area with a high degree of alignment, and the product reliability of the display apparatus 10 may be improved.

In some embodiments, in order to further improve the degree of alignment of the light-emitting elements 30, a process of irradiating light may be further performed during the manufacturing process of the display apparatus 10.

Figure 16:
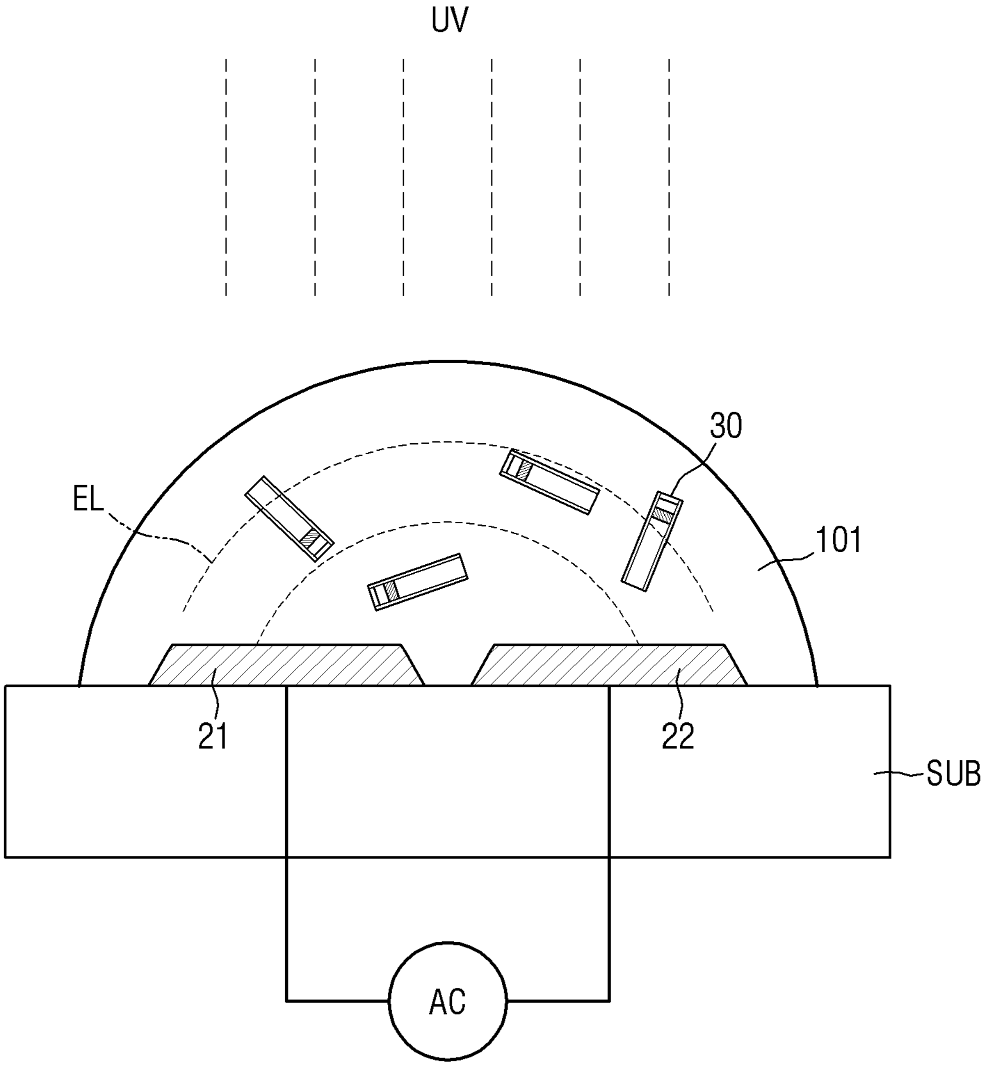
FIG. 16 is a cross-sectional view illustrating one operation of a manufacturing process of the display apparatus according to another embodiment.

FIG. 16 is a cross-sectional view illustrating one operation of a manufacturing process of the display apparatus according to another embodiment.

Referring to FIG. 16, in the manufacturing process of the display apparatus 10, a process of irradiating light (ultraviolet (UV) light) to light-emitting elements 30 sprayed onto a target substrate SUB may be performed in generating an electric field EL on electrodes 21 and 22. The light-emitting element 30 may have a dipole moment, and when the light-emitting element 30 is irradiated with the light (UV light), the light-emitting element 30 may react to the light (UV light) so that the dipole moment may be increased. The light-emitting elements 30 having the increased dipole moment may react to the electric field EL generated on the electrodes 21 and 22, so that first end portions thereof face a set or predetermined direction. Simultaneously or concurrently, at least one end portion of each of the light-emitting elements 30 may be provided on the first electrode 21 or the second electrode 22. For example, the light-emitting elements 30 may each have the first end portion provided on the first electrode 21 and a second end portion provided on the second electrode 22.

In seating the light-emitting element 30 on the electrodes 21 and 22, when the light-emitting element 30 is irradiated with the light (UV light) to generate the electric field EL, dielectrophoretic reactivity of the light-emitting elements 30 increases, so that the first end portion of each of the light-emitting elements 30 may be oriented in a set or predetermined direction. Accordingly, the light-emitting elements 30 provided on the electrodes 21 and 22 may be provided with a high degree of alignment, and the product reliability of the display apparatus 10 may be further improved.

In concluding the detailed description, those skilled in the art will appreciate that many variations and modifications can be made to the present embodiments without substantially departing from the principles of the disclosure as set forth in the following claims and their equivalents. Therefore, the disclosed embodiments of the present disclosure are used in a generic and descriptive sense only and not for purposes of limitation.

The invention claimed is:

1. A light-emitting element ink comprising:

a light-emitting element solvent comprising a compound represented by Chemical Formula 1; and a plurality of light-emitting elements dispersed in the light-emitting element solvent, each the plurality of light-emitting elements comprising a plurality of semiconductor layers and an insulation film partially around outer peripheral surfaces of the plurality of semiconductor layers, wherein the light-emitting element solvent comprises a fatty acid ester-based compound having a melting point in a range of 0° C. to 15° C.;

Chemical Formula 1

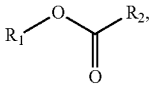

wherein, in Chemical Formula 1, $R_1$ and $R_2$ are each independently a linear or branched alkyl group, alkyl ether group, or alkenyl ether group having 1 to 25 carbon atoms, and at least one selected from among $R_1$ and $R_2$ in Chemical Formula 1 comprises a functional group represented by Chemical Formula 2:

Chemical Formula 2

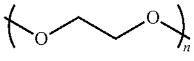

, and wherein, in Chemical Formula 2, n is in a range of 1 to 4, and a total number of oxygen atoms in Chemical Formula 1 is in a range of 2 to 10.

2. The light-emitting element ink of claim 1, wherein a sum of a number of carbon atoms of $R_1$ and a number of carbon atoms of $R_2$ is in a range of 14 to 49.

3. The light-emitting element ink of claim 1, wherein the light-emitting element solvent comprises a compound represented by one of Chemical Formulae 3 to 6:

Chemical Formula 3

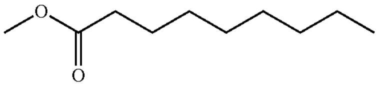

Chemical Formula 4

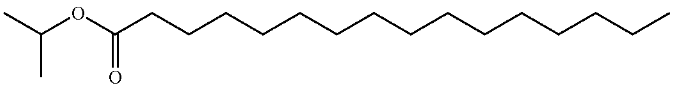

Chemical Formula 5

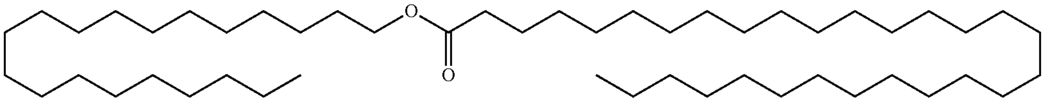

Chemical Formula 6

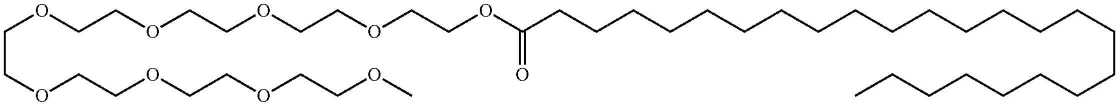

.

4. The light-emitting element ink of claim 2, wherein the light-emitting element solvent has a viscosity in a range of 8 cP to 10 cP, which is measured at room temperature.

5. The light-emitting element ink of claim 2, wherein the light-emitting element solvent has a dielectric constant in a range of 0.1 to 5.

6. The light-emitting element ink of claim 2, wherein the plurality of semiconductor layers of each of the plurality of light-emitting elements comprise a first semiconductor layer, a second semiconductor layer, and a light-emitting layer between the first semiconductor layer and the second semiconductor layer, and the insulation film is around at least an outer surface of the light-emitting layer.

* * * * *